(12) United States Patent
Miyashita et al.

(10) Patent No.: US 11,411,193 B2
(45) Date of Patent: Aug. 9, 2022

(54) ORGANIC LIGHT EMITTING ELEMENT, COMPRISING AT LEAST FIRST AND SECOND LIGHT EMITTING LAYERS WITH SATISFYING LOWEST UNOCCUPIED MOLECULAR ORBITAL (LUMO) AND HIGHEST OCCUPIED MOLECULAR ORBITAL (HOMO) RELATIONS

(71) Applicant: CANON KABUSHIKI KAISHA, Tokyo (JP)

(72) Inventors: Hirokazu Miyashita, Ebina (JP); Itaru Takaya, Atsugi (JP); Naoki Yamada, Inagi (JP); Isao Kawata, Kawasaki (JP); Yuto Ito, Kokubunji (JP); Jun Kamatani, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 133 days.

(21) Appl. No.: 16/900,763

(22) Filed: Jun. 12, 2020

(65) Prior Publication Data
US 2020/0403173 A1 Dec. 24, 2020

(30) Foreign Application Priority Data
Jun. 20, 2019 (JP) ............................. JP2019-114967

(51) Int. Cl.
*H01L 51/50* (2006.01)
*H01L 27/32* (2006.01)
*H01L 51/52* (2006.01)

(52) U.S. Cl.
CPC ...... *H01L 51/5004* (2013.01); *H01L 27/3234* (2013.01); *H01L 27/3262* (2013.01); *H01L 51/5036* (2013.01); *H01L 51/5206* (2013.01); *H01L 51/5221* (2013.01); *H01L 2251/552* (2013.01)

(58) Field of Classification Search
None
See application file for complete search history.

(56) References Cited

U.S. PATENT DOCUMENTS

2004/0241491 A1    12/2004  Hatwar
2019/0333968 A1*   10/2019  Yamada .............. H01L 51/5036

* cited by examiner

*Primary Examiner* — Daniel Whalen
(74) *Attorney, Agent, or Firm* — Canon U.S.A., Inc., IP Division

(57) ABSTRACT

An organic light emitting element includes, in sequence, an anode, a first light emitting layer, a second light emitting layer, and a cathode. The first light emitting layer includes a first compound and a first light emitting material. The second light emitting layer includes a second compound and a second light emitting material having an energy gap different from an energy gap of the first light emitting material. The organic light emitting element satisfies relations (a) to (c).

$$LUMO(H1) > LUMO(D1) \qquad (a)$$

$$LUMO(H2) > LUMO(D2) \qquad (b)$$

$$LUMO(H2) - LUMO(D2) > LUMO(H1) - LUMO(D1) \qquad (c)$$

Where LUMO (H1), LUMO (D1), LUMO (H2), and LUMO (D2) represent a LUMO level of the first compound, a LUMO level of the first light emitting material, a LUMO level of the second compound, and a LUMO level of the second light emitting material, respectively.

19 Claims, 6 Drawing Sheets

ORGANIC LIGHT EMITTING ELEMENT, COMPRISING AT LEAST FIRST AND SECOND LIGHT EMITTING LAYERS WITH SATISFYING LOWEST UNOCCUPIED MOLECULAR ORBITAL (LUMO) AND HIGHEST OCCUPIED MOLECULAR ORBITAL (HOMO) RELATIONS

BACKGROUND OF THE INVENTION

Field of the Invention

The present disclosure relates to an organic light emitting element, and a display apparatus, an electronic device, an image pickup apparatus, an illumination apparatus, and a moving object including the organic light emitting element.

Description of the Related Art

An organic light emitting element emits light upon energization of an organic electroluminescent (EL) layer including an anode, a cathode, and a light emitting layer disposed between these electrodes.

Intensive research and development of full-color displays including organic light emitting elements have recently been conducted. It is known that organic light emitting elements are broadly classified into hole-trapping type and electron-trapping type depending on the type of compound contained in a light emitting layer, and an energy diagram design suitable for each element is desired.

Full-color displays are produced by the following two known methods. In one method, different light emitting layers are allocated to pixels (elements). In the other method, an organic light emitting element including a white-light emitting layer and different color filters allocated to pixels is used. It is known that when a white-light emitting layer is used, an organic light emitting element includes two or more light emitting materials.

US2004/0241491 (hereinafter referred to as PTL 1) discloses an organic light emitting element that includes an anode, an electron-trapping yellow-light emitting layer on the anode, and an electron-trapping blue-light emitting layer on the yellow-light emitting layer and emits white light.

However, the organic light emitting element disclosed in PTL 1 may emit light whose chromaticity varies depending on the density of a current supplied. The organic light emitting element in PTL 1 is configured such that the difference in LUMO energy between a light emitting layer host and a light emitting layer dopant in the blue-light emitting layer is smaller than the difference in LUMO energy between a light emitting layer host and a light emitting layer dopant in the adjacent yellow-light emitting layer.

Thus, the blue-light emitting layer has lower electron-trapping properties than the yellow-light emitting layer, and recombination is more likely to occur on the yellow-light emitting layer side. Thus, the blue-light emitting layer is less likely to emit light. In particular, this situation often occurs at a low current density. Consequently, the organic light emitting element disclosed in PTL 1 is an organic light emitting element that undergoes a great change in light emission balance between the yellow-light emitting layer and the blue-light emitting layer depending on the current density.

SUMMARY OF THE INVENTION

The present disclosure has been made in view of the above disadvantages and aims to provide an organic light emitting element less likely to undergo a change in light emission balance due to a change in current density.

An organic light emitting element according to an embodiment of the present disclosure includes, in sequence, an anode, a first light emitting layer, a second light emitting layer, and a cathode. The first light emitting layer includes a first compound and a first light emitting material. The second light emitting layer includes a second compound and a second light emitting material having an energy gap different from an energy gap of the first light emitting material. The organic light emitting element satisfies the following relations (a) to (d).

$$LUMO(H1) > LUMO(D1) \quad (a)$$

$$LUMO(H2) > LUMO(D2) \quad (b)$$

$$LUMO(H2) - LUMO(D2) > LUMO(H1) - LUMO(D1) \quad (c)$$

$$LUMO(H3) > LUMO(D3) \quad (d)$$

LUMO (H1), LUMO (D1), LUMO (H2), and LUMO (D2) represent a lowest unoccupied molecular orbital (LUMO) level of the first compound, a LUMO level of the first light emitting material, a LUMO level of the second compound, and a LUMO level of the second light emitting material, respectively.

Further features of the present disclosure will become apparent from the following description of exemplary embodiments with reference to the attached drawings.

DESCRIPTION OF THE EMBODIMENTS

Figure 1A:
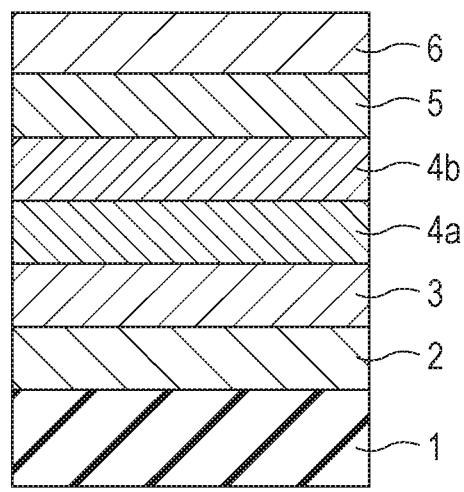
FIGS. 1A and 1B are schematic sectional views illustrating examples of an organic light emitting element according to an embodiment of the present disclosure.

An organic light emitting element according to an embodiment of the present disclosure includes, in sequence, an anode, a first light emitting layer, a second light emitting layer, and a cathode. At least one of the anode and the cathode may be a light-transmitting electrode, and one of them may be a reflective electrode. The first light emitting layer includes a first compound and a first light emitting material. The second light emitting layer includes a second compound and a second light emitting material having an energy gap different from an energy gap of the first light emitting material.

The first compound is also referred to as a host of the first light emitting material. In the first light emitting layer, the weight percentage of the first compound may be higher than that of the first light emitting material. Also in the second light emitting layer, the weight percentage of the second compound may be higher than that of the second light emitting material.

Since the energy gap of the second light emitting material is different from the energy gap of the first light emitting material, the light emitted from the second light emitting material and the light emitted from first light emitting material are different from each other. The energy gap of the second light emitting material may be larger than the energy gap of the first light emitting material. That is, the second light emitting material may have a shorter emission wavelength than the first light emitting material. More specifically, the second light emitting material may be a light emitting material that emits blue light.

An organic light emitting element according to an embodiment of the present disclosure satisfies the following relations (a) to (c).

$$\text{LUMO}(H1) > \text{LUMO}(D1) \quad (a)$$

$$\text{LUMO}(H2) > \text{LUMO}(D2) \quad (b)$$

(a) and (b) indicate being an electron-trapping light emitting layer that traps electrons therein.

$$\text{LUMO}(H2) - \text{LUMO}(D2) > \text{LUMO}(H1) - \text{LUMO}(D1) \quad (c)$$

LUMO (H1), LUMO (D1), LUMO (H2), and LUMO (D2) represent a LUMO level of the first compound, a LUMO level of the first light emitting material, a LUMO level of the second compound, and a LUMO level of the second light emitting material, respectively.

(c) indicates that the difference in LUMO level is larger in the second light emitting layer than in the first light emitting layer, which can reduce the change in light emission balance due to a change in current density. In this specification, the difference between a LUMO level of the first compound and a LUMO level of the first light emitting material may be expressed as ΔLUMO. This also applies to the second light emitting layer and the third light emitting layer.

In this specification, LUMO means the lowest unoccupied molecular orbital, and LUMO levels closer to the vacuum level are expressed as higher. HOMO means the highest occupied molecular orbital, and HOMO levels closer to the vacuum level are expressed as higher.

Measured values and calculated values thereof are expressed as negative values with respect to the vacuum level. In this specification, additions and subtractions of LUMO levels and HOMO levels are performed using negative values obtained by measurement and calculation.

In this specification, the term "energy gap" refers to a gap of energy between a LUMO level and a HOMO level and is also referred to as a band gap.

Hereinafter, embodiments of the present disclosure will be described in more detail with reference to FIG. 1. FIGS. 1A and 1B are schematic sectional views of organic light emitting elements according to these embodiments. In the organic light emitting element in FIG. 1A, an anode 2, a hole transport layer 3, a first light emitting layer 4a, a second light emitting layer 4b, an electron transport layer 5, and a cathode 6 are disposed in this order on an insulating layer 1.

Figure 1B:
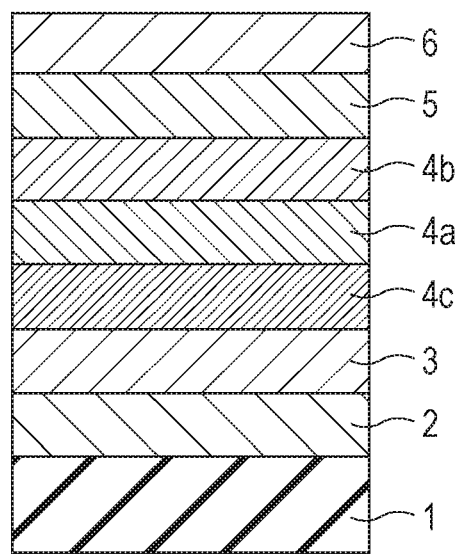

In FIG. 1B, an insulating layer 1, an anode 2, a hole transport layer 3, a third light emitting layer 4c, a first light emitting layer 4a, a second light emitting layer 4b, an electron transport layer 5, and a cathode 6 are disposed in this order. The first light emitting layer 4a, the second light emitting layer 4b, and the third light emitting layer 4c have dopants of different emission colors. These layer structures are given by way of illustration, and other organic compound layers may be present.

In these embodiments, a light emitting layer refers to an organic compound layer that is disposed between electrodes and that emits light. Among compounds contained in the light emitting layer, a compound whose weight percentage is the highest may be referred to as a host, and a compound that contributes to main light emission may be referred to as a dopant or a guest. More specifically, the host may be a material contained in an amount of more than 50 wt % in the light emitting layer. More specifically, the dopant is a material contained in an amount of less than 50 wt % in the light emitting layer. The concentration of the dopant in the light emitting layer is preferably 0.1 mass % or more and 20 mass % or less, and more preferably 10 mass % or less in order to reduce concentration quenching.

Figure 2:
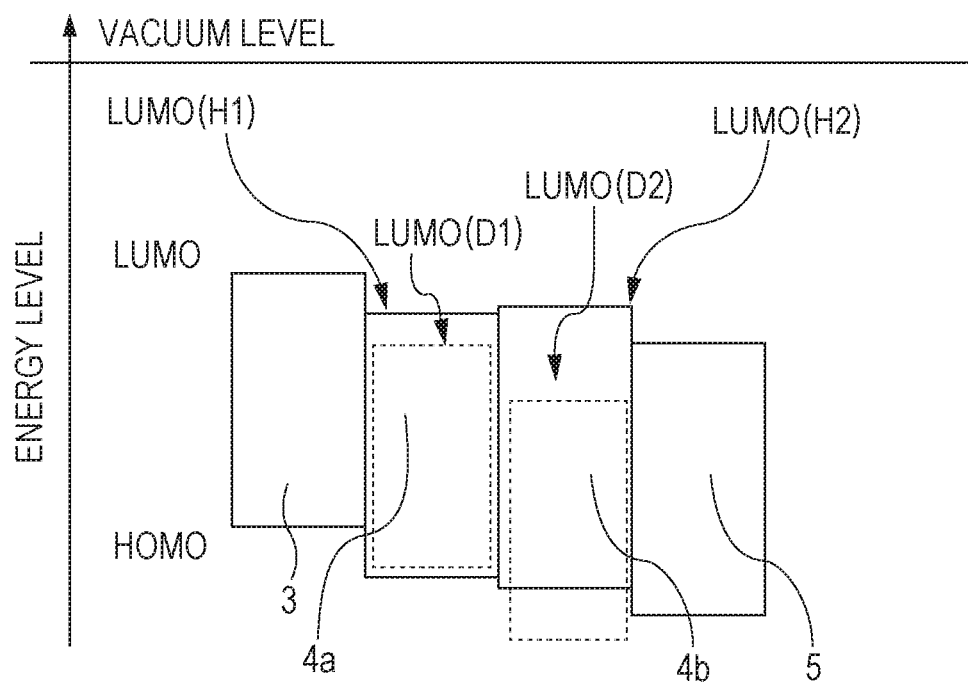
FIG. 2 is an energy diagram schematically illustrating energy levels of light emitting layers and layers nearby constituting an organic light emitting element according to an embodiment of the present disclosure.

FIG. 2 is an energy diagram schematically illustrating energy levels of light emitting layers and layers nearby constituting an organic light emitting element according to an embodiment of the present disclosure. The vertical axis in FIG. 2 represents energy level, and the arrow indicates the direction in which the energy of electrons increases. That is, the energy of electrons is higher at upper parts of the figure. In the figure, the solid line of the first light emitting layer 4a represents energy levels of the first compound, and the broken line represents energy levels of the first light emitting material. The higher energy level in terms of electrons is the LUMO level, and the lower energy level in terms of electrons is the HOMO level. In the second light emitting layer 4b, the solid line represents the second compound, and the broken line represents the second light emitting material.

As illustrated in FIG. 2, in the present disclosure, the following relation (a) is satisfied between a first host and a first dopant contained in the first light emitting layer 4a.

$$\text{LUMO}(H1) > \text{LUMO}(D1) \quad (a)$$

In (a), LUMO (H1) represents a LUMO energy of the first host, and LUMO (D1) represents a LUMO energy of the first dopant.

The following relation (b) is satisfied between a second host and a second dopant contained in the second light emitting layer 4b.

$$\text{LUMO}(H2) > \text{LUMO}(D2) \quad (b)$$

In (b), LUMO (H2) represents a LUMO energy of the second host, and LUMO (D2) represents a LUMO energy of the second dopant.

In addition, the following relation (c) is satisfied between the first light emitting layer 4a and the second light emitting layer 4b.

$$\text{LUMO}(H2) - \text{LUMO}(D2) > \text{LUMO}(H1) - \text{LUMO}(D1) \quad (c)$$

In the present disclosure, HOMO levels and LUMO levels may be measured values or values determined by molecular orbital calculations. In this specification, the molecular orbital calculations were performed using the density functional theory (DFT), which is now widely used. In the molecular orbital calculations, the B3LYP functional and the 6-31G* basis function were used. More specifically, the molecular orbital calculation was performed by Gaussian09 (Gaussian 09, Revision C.01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2010).

In EXAMPLES described later, calculated values obtained by the molecular orbital calculations are compared with measured values to verify the accuracy of the calculated values.

An organic light emitting element according to an embodiment of the present disclosure has an element configuration including two or more light emitting layers and satisfies the following conditions.

(0) The two light emitting layers have electron-trapping properties.

In an organic light emitting element according to an embodiment of the present disclosure, the light emitting layers have electron-trapping properties and thus keep electrons more efficiently than hole-trapping light emitting layers. Therefore, electrons injected from the cathode can be inhibited from moving to the anode through the light emitting layers. If electrons injected from the cathode move to the anode through the light emitting layers, supplied energy does not contributes to light emission. Thus, electrons moving to the anode are preferably reduced.

In an organic light emitting element, charges (holes and electrons) in a light emitting layer move in the light emitting layer back and forth between levels of a host and a dopant. In other words, charges in a light emitting layer move in the light emitting layer while being repeatedly trapped by or detrapped from a host or a dopant. The greater the difference in HOMO or LUMO energy between the host and the dopant, the lower the mobility of the charges and the higher the trapping properties.

More specifically, when the LUMO level of the dopant is lower than the LUMO level of the host, the light emitting layer has electron-trapping properties, and the electron-trapping properties increases as the LUMO level of the dopant decreases. When the HOMO level of the dopant is higher than the HOMO level of the host, the light emitting layer has hole-trapping properties.

In the present disclosure, the above relations (a) and (b) are satisfied. That is, the two light emitting layers (4a and 4b) serve as electron-trapping light emitting layers, and the electron mobility in the light emitting layers (4a and 4b) is low. By using the electron-trapping light emitting layers, electrons can be inhibited from moving to the anode through the light emitting layers.

Also when the organic light emitting element has a hole transport layer between the light emitting layers and the anode, injected electrons are preferably inhibited from reaching the hole transport layer through the light emitting layers.

An amine compound contained in the hole transport layer has an unshared electron pair (a lone pair). Thus, the amine compound is unstable when brought into a radical anion state by accepting an electron while being stable against being brought into a radical cation state by releasing an electron. That is, when an electron reaches the hole transport layer, the electron and the amine compound forming the hole transport layer interact with each other to cause material deterioration, thus leading to reduction in light emission efficiency and durability. Since the two light emitting layers according to this embodiment have electron-trapping properties, deterioration of the hole transport layer due to electrons can be reduced to provide the organic light emitting element with high durability.

An organic light emitting element according to an embodiment of the present disclosure includes an electron-trapping first light emitting layer and an electron-trapping second light emitting layer and also satisfy the following conditions, and thus is less likely to undergo a change in light emission balance due to a change in current density.

(1) Among the two light emitting layers, the light emitting layer on the cathode side has higher electron-trapping properties than the light emitting layer on the anode side.

In the case of an organic light emitting element including a plurality of light emitting layers, particularly, light emitting layers in contact with each other, the light emission balance of the organic light emitting element may change depending on the current density because recombination regions can change depending on the current density.

The present inventors conducted intensive studies and discovered that an element configuration in which the second light emitting layer 4b on the cathode side has higher electron-trapping properties than the first light emitting layer 4a on the hole transport layer side can provide an organic light emitting element that exhibits light emission with low current density dependence.

With the above configuration, recombination centers can be localized in the second light emitting layer 4b regardless of current density. When the second light emitting layer has higher electron-trapping properties than the first light emitting layer, the amount of recombination occurring in the second light emitting layer is larger than the amount of recombination occurring in the first light emitting layer. The excitation energy generated in the second light emitting layer 4b can be redistributed to the first light emitting layer 4a through energy transfer. Since the energy transfer does not depend on the current supplied, the first light emitting layer 4a and the second light emitting layer 4b can provide light emission with reduced current density dependence. As a result, an organic light emitting element having low current density dependence and a good light emission balance can be obtained. The effect of providing a light emission balance by the above configuration is large when the energy gap of the second light emitting material is larger than the energy gap of the first light emitting material.

In an embodiment of the present disclosure, recombination centers are localized in the second light emitting layer 4b by focusing on the difference in electron-trapping properties between the second light emitting layer 4b and the adjacent first light emitting layer 4a. Specifically, when the light emitting layer on the cathode side among the light emitting layers adjacent to each other has relatively higher electron-trapping properties, the electron density of the light emitting layer on the cathode side can be increased to localize recombination centers.

As described above, in the case of an organic light emitting element including a plurality of light emitting layers, it is preferable to consider the relation between the light emitting layers, unlike the case of an organic light emitting element including a single light emitting layer. When the above condition (1) is satisfied, an organic light emitting element less likely to undergo a change in light emission balance due to a change in current density can be obtained.

An organic light emitting element according to an embodiment of the present disclosure may satisfy the following conditions in addition to the above condition (1).

(2) The organic light emitting element includes a third light emitting layer, and the third light emitting layer has electron-trapping properties.

(3) The second light emitting material has a lower LUMO level than the first light emitting material.

(4) The first light emitting layer contains a third light emitting material having a LUMO energy lower than the LUMO energy of the first compound.

(5) The electron-trapping properties of the first to third light emitting layers are higher than their hole-trapping properties.

(6) The HOMO level of the second light emitting material is lower than the HOMO level of the second compound.

(7) The second light emitting layer is a light emitting layer that emits blue light.

(8) The first to third compounds are each a compound consisting of a hydrocarbon.

(9) The first to third light emitting materials have a fluoranthene skeleton.

(10) The light emitting material that emits blue light has two or more electron-withdrawing substituents.

These conditions will be described below.

(2) The organic light emitting element includes a third light emitting layer, and the third light emitting layer has electron-trapping properties.

The light emitting layers ($4a$, $4b$, and $4c$) in FIG. 1B each contain a host and a dopant. Specifically, the first light emitting layer $4a$ contains a first compound (host) and a first light emitting material (dopant), and the second light emitting layer $4b$ contains a second compound (host) and a second light emitting material (dopant). When the third light emitting layer $4c$ is present, the third light emitting layer contains a third compound (host) and a third light emitting material (dopant).

When the third light emitting layer is present between the first light emitting layer and the anode so as to be adjacent to the first light emitting layer, as illustrated in FIG. 1B, it is preferred that the following relation (d) be satisfied between the third compound and the third light emitting material, that is, the third light emitting layer be of electron-trapping type.

$$\text{LUMO}(H3) > \text{LUMO}(D3) \tag{d}$$

In (d), LUMO (H3) represents a LUMO energy of the third compound, and LUMO (D3) represent a LUMO energy of the third light emitting material. When the relation (d) is satisfied, the third light emitting layer has electron-trapping properties.

By further disposing an electron-trapping light emitting layer on the anode side as illustrated in FIG. 1B, electrons moving to the anode can be reduced to improve durability.

(3) The second light emitting material has a lower LUMO level than the first light emitting material.

To improve the electron-trapping properties of the second light emitting layer $4b$ and make the second light emitting layer $4b$ serve as a recombination center, the LUMO energy of the second dopant may be smaller than that of the first dopant (far from the vacuum level).

Specifically, the following relation (e) may be satisfied between the first dopant and the second dopant as illustrated in FIG. 2.

$$\text{LUMO}(D1) > \text{LUMO}(D2) \tag{e}$$

When this relation is satisfied, electrons moving from the second light emitting material to the first light emitting material can be reduced, and as a result, the electron-trapping properties of the second light emitting layer can be improved to localize recombination centers in the second light emitting layer.

(4) The first light emitting layer contains a third light emitting material having a LUMO energy lower than the LUMO energy of the first compound.

When the third light emitting layer is not present as illustrated in FIG. 1A, the first light emitting layer further contains a third light emitting material (dopant). The following relation (f) may be satisfied between the first compound (host) and the third light emitting material (dopant).

$$\text{LUMO}(H1) > \text{LUMO}(D3) \tag{f}$$

In (f), LUMO (H1) represents a LUMO energy of the first compound, and LUMO (D3) represents a LUMO energy of the third light emitting material. When the relation (f) is satisfied, the electron-trapping properties of the first light emitting layer can be improved to reduce electrons reaching the hole transport layer, thereby improving durability.

(5) The electron-trapping properties of the first to third light emitting layers are higher than their hole-trapping properties.

The light emitting layers having electron-trapping properties not only reduces deterioration of an organic compound layer on the anode side, such as a hole transport layer, but also improves durability.

For example, it is known that deterioration of tris(8-quinolinato)aluminum ($AlQ_3$), which is a host of a light emitting layer, is partly due to the instability of radical cations generated as a result of hole conduction. To reduce such radical-cation-induced deterioration in a light emitting layer, the hole density in the light emitting layer may be reduced. This can be achieved by increasing the electron density in the light emitting layer by reducing hole-trapping properties and improving electron-trapping properties.

Specifically, referring to the first light emitting layer $4a$ in FIG. 2, the following relation (g) may be satisfied.

$$\text{LUMO}(H1) - \text{LUMO}(D1) > \text{HOMO}(D1) - \text{HOMO}(H1) \tag{g}$$

When the relation (g) is satisfied, the first light emitting layer can have reduced hole-trapping properties and improved electron-trapping properties.

(6) The HOMO level of the second light emitting material is lower than the HOMO level of the second compound.

In the second light emitting layer, the following relation (h) may be satisfied between the second compound and the second light emitting material.

$$\text{HOMO}(H2) > \text{HOMO}(D2) \tag{h}$$

In (h), HOMO (H2) and HOMO (D2) represent a HOMO level of the second compound (host) and a HOMO level of the second light emitting material (dopant), respectively. When the relation (h) is satisfied, the hole-trapping properties of the second light emitting layer can be reduced.

With the above configuration, the effect of localizing recombination regions in the second light emitting layer can be increased. In addition, when the relation (h) is satisfied, the electron-trapping properties of the second light emitting layer can be relatively improved.

(7) The second light emitting layer is a light emitting layer that emits blue light.

As described in (1), the effect of providing a good light emission balance is large when the energy gap of the second light emitting material is larger than the energy gap of the first light emitting material. More preferably, the second light emitting material is a blue-light emitting material. Preferably, the first light emitting material and the third light emitting material are each a red-light emitting material or a green-light emitting material. If the first light emitting material is a green-light emitting material, the third light emitting material is a red-light emitting material, and if the first light emitting material is a red-light emitting material, the third light emitting material is a green-light emitting material. In an organic light emitting element according to an embodiment of the present disclosure, the second light emitting layer which has a large energy gap may contain a blue-light emitting material to localize recombination regions in the second light emitting layer. This is because a layer structure that allows the excitation energy generated by the blue-light emitting material to transfer to the red-light emitting material and the green-light emitting material, each having a small energy gap, more readily provides well-balanced light emission. The second light emitting material is preferably a blue-light emitting material also because a structure that allows blue light having low standard luminous efficiency to be readily emitted is preferred.

In the case of the structure illustrated in FIG. 1A, since the red-light emitting material and the green-light emitting material having different energy gaps coexist in the first light emitting layer, energy transfer to the red-light emitting material having a small energy gap is more likely to occur than energy transfer to the green-light emitting material. Thus, the weight percentage of the red-light emitting material may be lower than the weight percentage of the green-light emitting material. The weight percentage of the red-light emitting material is preferably not more than ⅕, more preferably not more than 1/10, of that of the green-light emitting material. This enables adjustment of the balance of light emission intensity between the red and green dopants. The weight percentage can be controlled by the concentration of doping and thus is also referred to as doping concentration. The light emitting materials can also be referred to as dopants for their low weight percentages.

In this specification, the blue-light emitting material refers to a light emitting material having an emission spectrum with a maximum peak wavelength of 430 nm to 480 nm. The green-light emitting material refers to a light emitting material having an emission spectrum with a maximum peak wavelength of 500 nm to 570 nm. The red-light emitting material refers to a light emitting material having an emission spectrum with a maximum peak wavelength of 580 nm to 680 nm. The emission spectra may be measured with the influence of other compounds and crystalline states being reduced, for example, by a dilute toluene solution.

(8) The first to third compounds are each a compound consisting of a hydrocarbon.

In an embodiment of the present disclosure, the first to third compounds are not particularly limited and may each be a compound not having a bond with a low binding energy in its molecular structure. A compound having a bond with a low binding energy in its molecular structure is likely to deteriorate and thus reduces the operating life of the organic light emitting element. Therefore, the first to third compounds may each be a compound consisting of a hydrocarbon such as an aromatic hydrocarbon having a relatively high binding energy. The first to third compounds are each used, for example, as a host.

For example, in the case of a compound CBP ([4,4'-bis(carbazol-9-yl)biphenyl]) shown below, the bond with a low binding energy is a bond (nitrogen-carbon bond) that binds a carbazole ring and a phenylene group together. The calculated value of binding energy of CBP and the calculated value of an exemplary host compound EM1 are compared below. The calculation is performed using b3-lyp/def2-SV(P).

Binding Energy (Calculated Values)

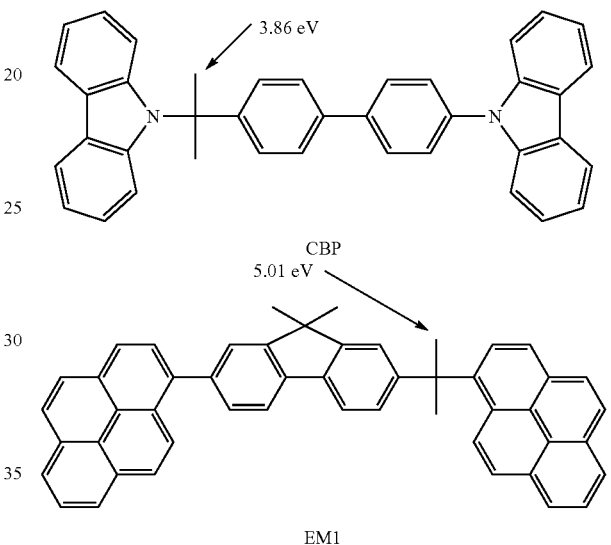

The above results show that the host of an organic light emitting element according to an embodiment of the present disclosure may be a compound consisting of a hydrocarbon, which is formed by carbon-carbon bonds and has a high binding energy.

However, when the host is a compound consisting of a hydrocarbon, the LUMO level of the host is low, and thus the LUMO level of a light emitting material is required to be lower in order to form a light emitting layer having high electron-trapping properties. For the LUMO level of the light emitting material to be lower, the following condition (9) may be satisfied.

(9) The first to third light emitting materials have a fluoranthene skeleton.

The compound used as a light emitting material is not particularly limited, and in terms of the electron-trapping properties described above, the compound may have a fluoranthene skeleton which is an electron-withdrawing structure. This is because the presence of a fluoranthene skeleton having an electron deficient five-membered ring lowers the LUMO level. As a result, the difference in LUMO level between the light emitting material and the host tends to be large, leading to improved electron-trapping properties.

The compound need not necessarily have, as a substituent of the light emitting material, an electron-donating substituent such as a substituted amino group. This is because the presence of an electron-donating substituent such as a substituted amino group increases the LUMO level, resulting in reduced electron-trapping properties.

Also in terms of binding stability, the compound may be a compound that does not have a substituted amino group that forms a nitrogen-carbon bond.

Next, the fluoranthene skeleton will be described. The term "fluoranthene skeleton" refers to fluoranthene and a fused polycyclic compound formed of fluoranthene and an aromatic hydrocarbon fused together. Specific examples include fused polycyclic compounds FF1 to FF33 shown below.

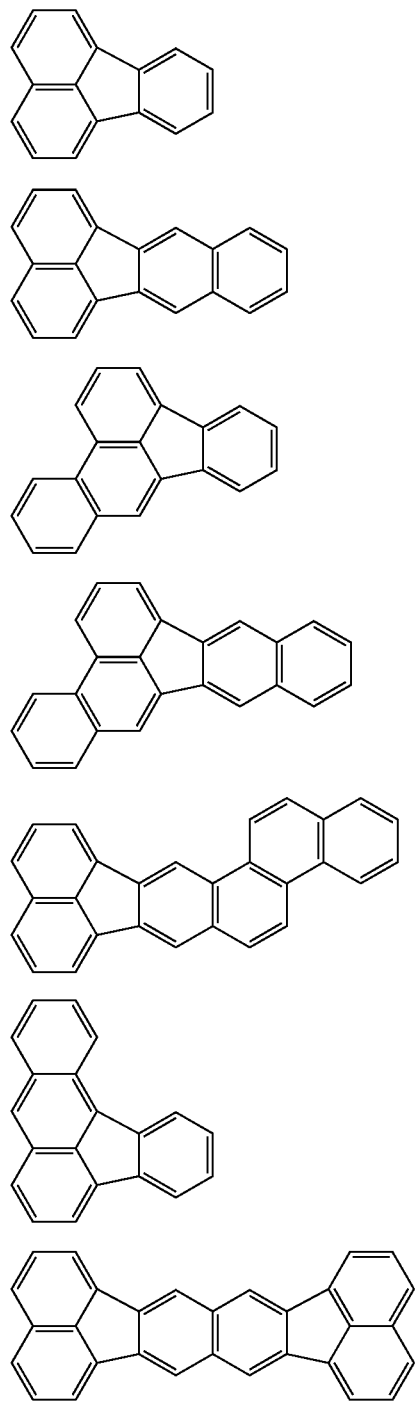

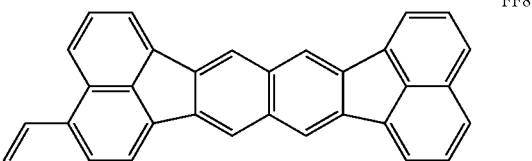

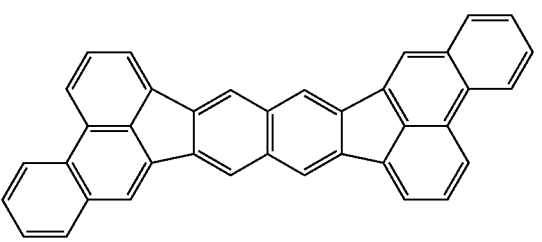

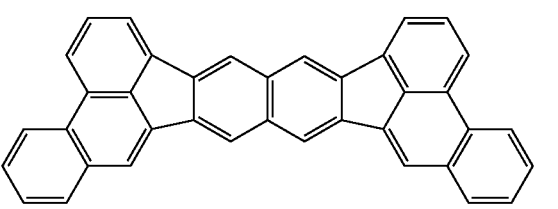

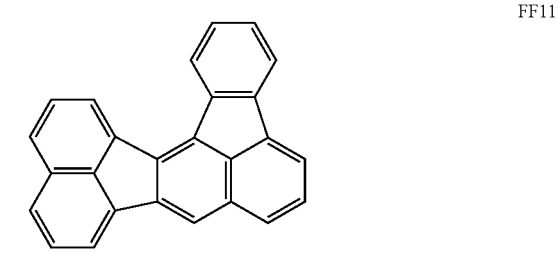

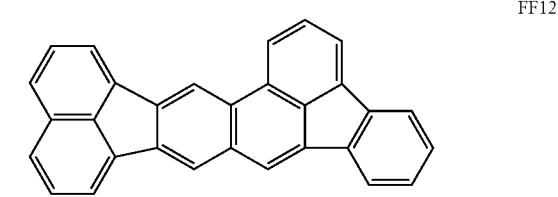

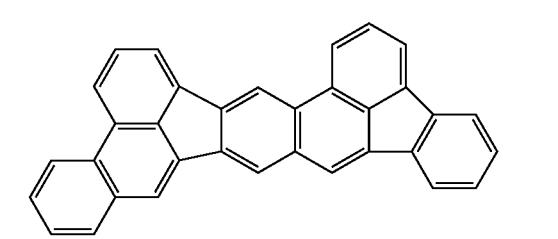

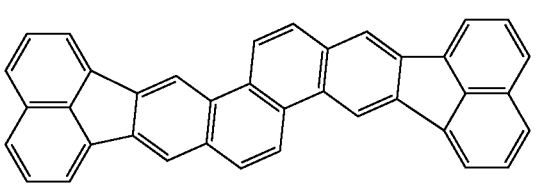

FF15
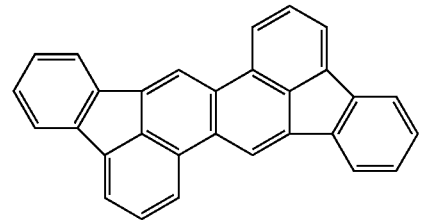
FF16
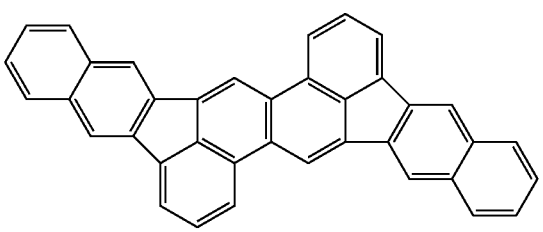
FF17
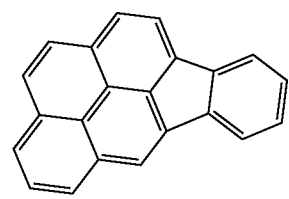
FF18
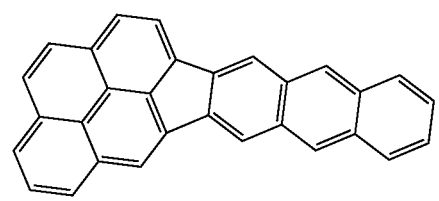
FF19
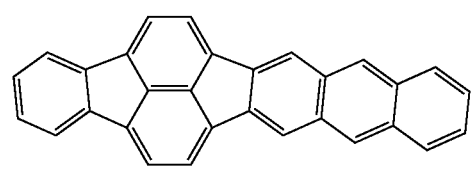
FF20
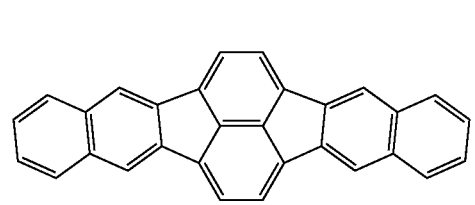
FF21
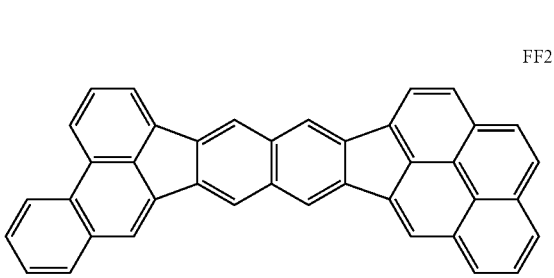
FF22
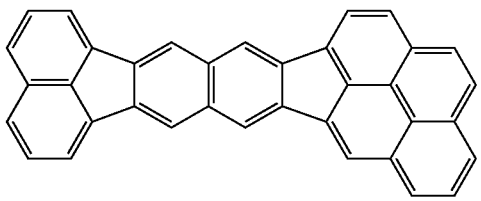
FF23
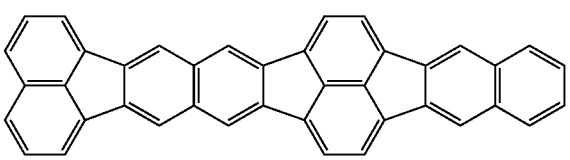
FF24
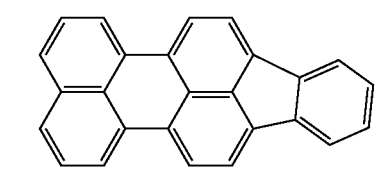
FF25
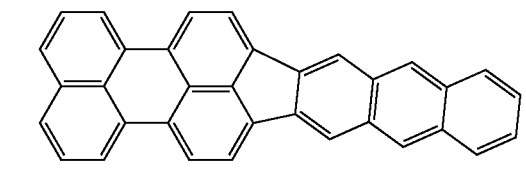
FF26
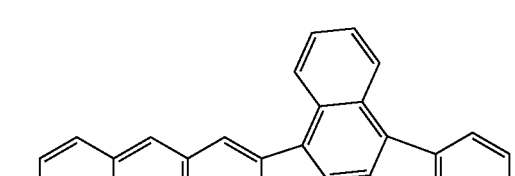
FF27
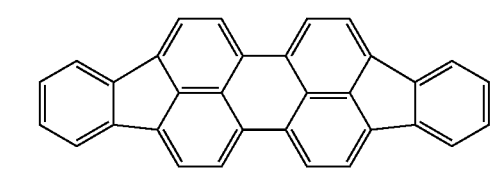
FF28
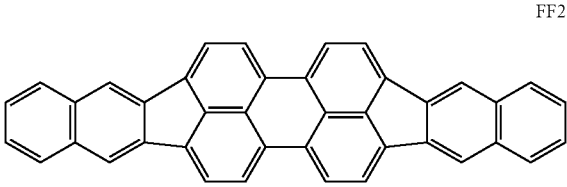
FF29
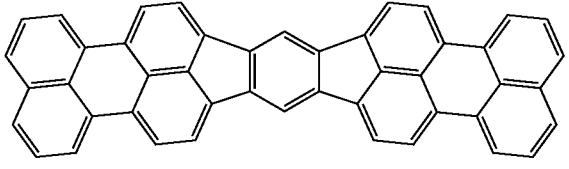

-continued

FF30
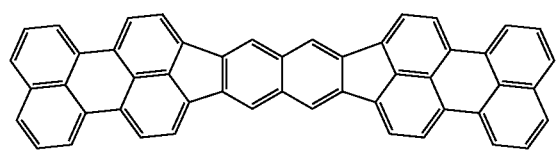

FF31
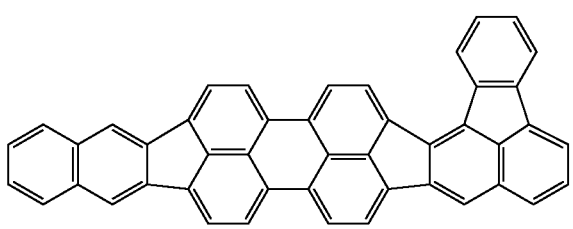

FF32
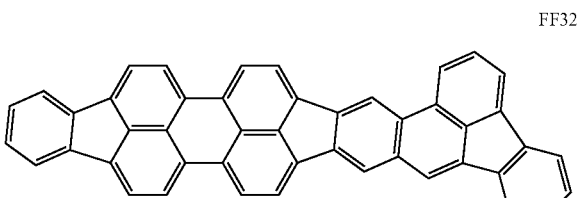

FF33
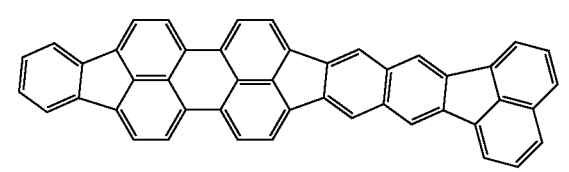

Of these, to further improve electron-withdrawing properties and improve electron-trapping properties, dopants having a structure in which two or more fluoranthenes are fused together may be used. Specifically, light emitting materials having skeletons FF7 to FF16, FF19 to FF23, and FF26 to FF33 are suitable for use in an organic light emitting element according to an embodiment of the present disclosure.

(10) The light emitting material that emits blue light has two or more electron-withdrawing substituents.

The blue-light emitting material in an embodiment of the present disclosure is a compound having a low LUMO level. A low LUMO level can be achieved, for example, by introducing an electron-withdrawing substituent. Examples of electron-withdrawing substituents include a fluorine atom, a trifluoromethyl group, a cyano group, a nitro group, an isocyanate group, and an isothiocyanate group. Of these, a fluorine atom and a cyano group are particularly preferred in terms of the stability of the substituent. Specific examples include the following light emitting materials.

BD1
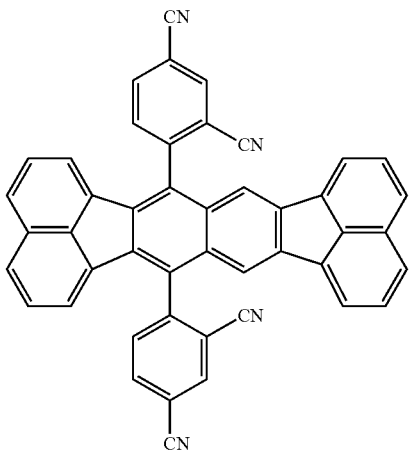

BD2
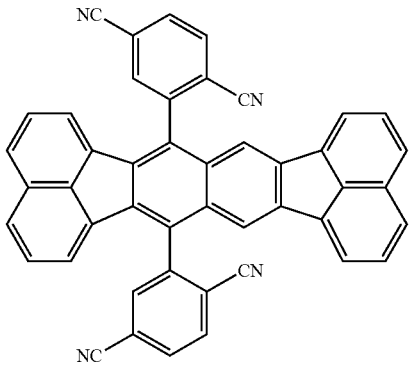

BD3
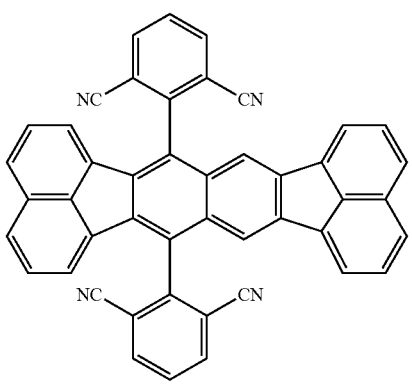

-continued
BD4
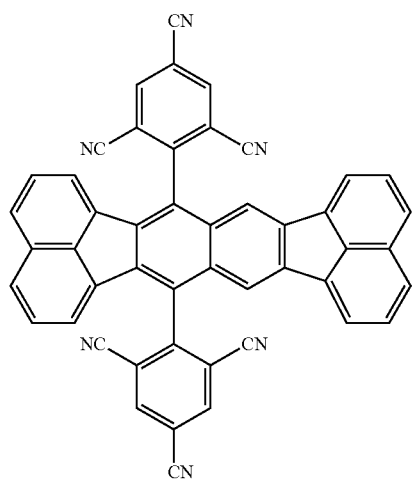
BD5
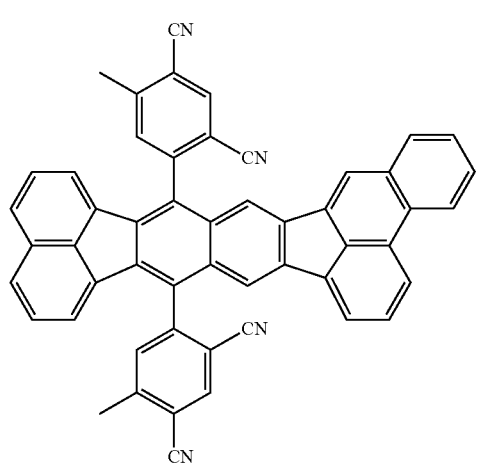
BD6
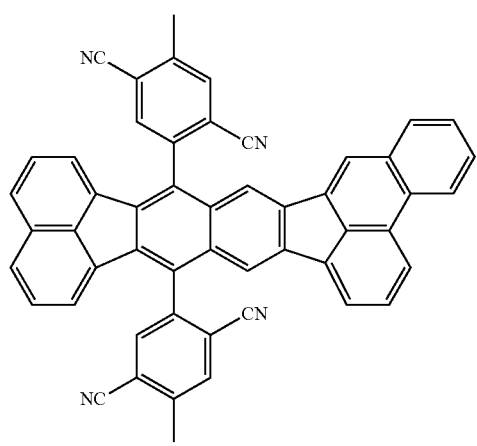
-continued
BD7
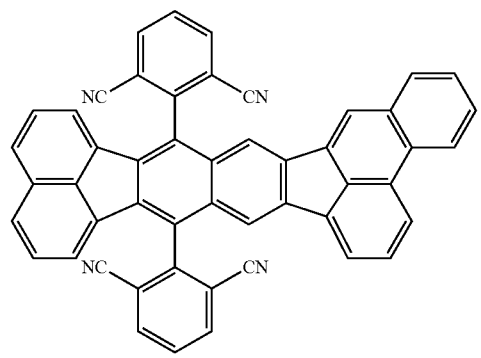
BD8
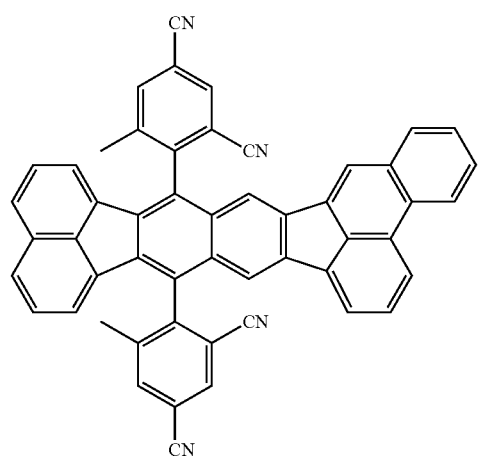
BD9
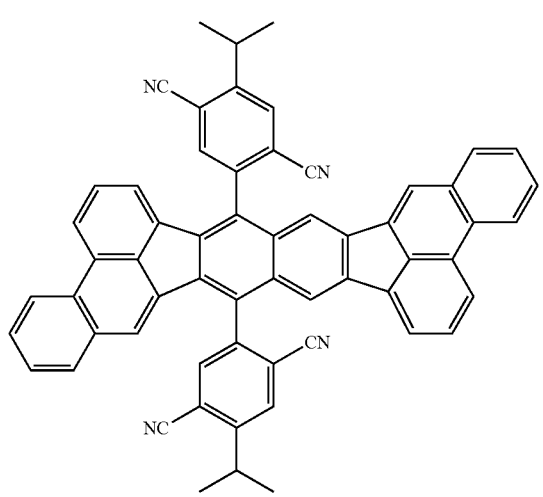

BD10
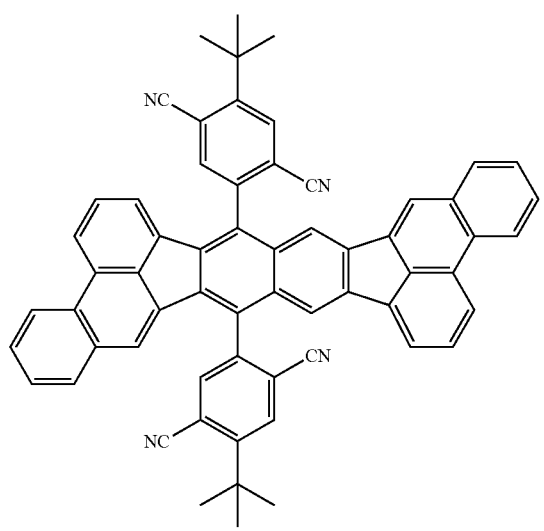
BD13
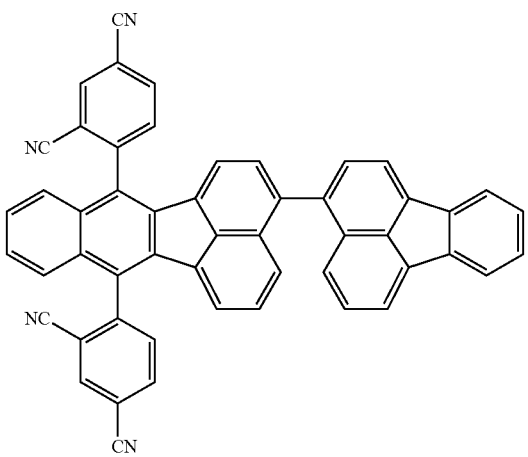
BD11
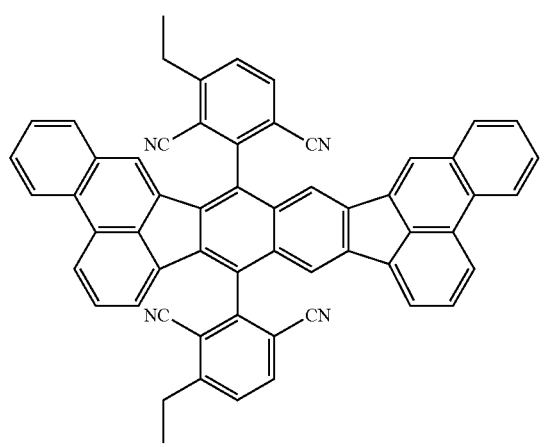
BD14
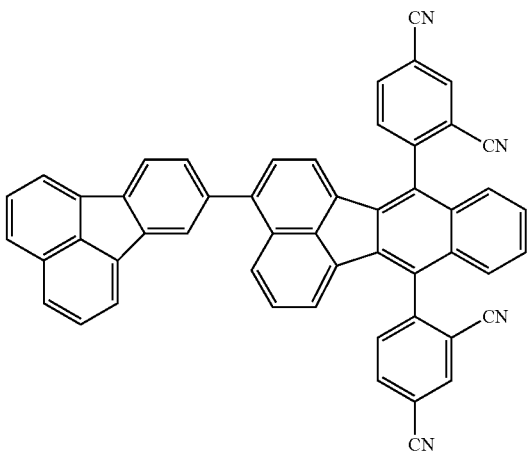
BD12
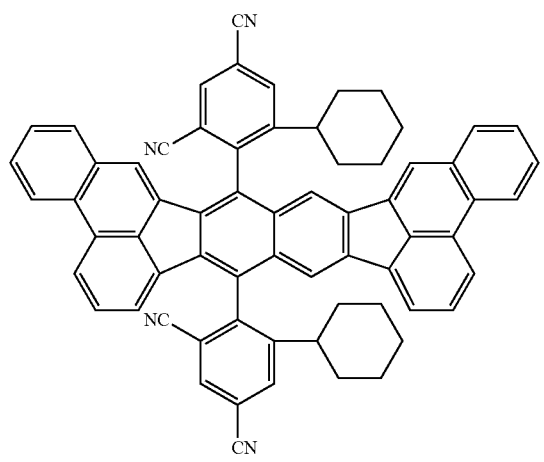
BD15
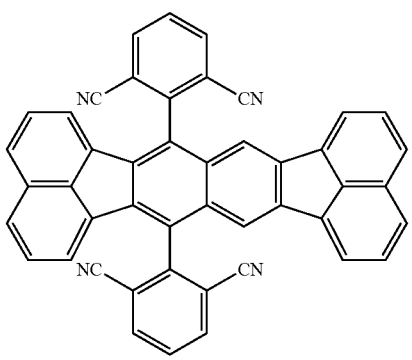

BD16
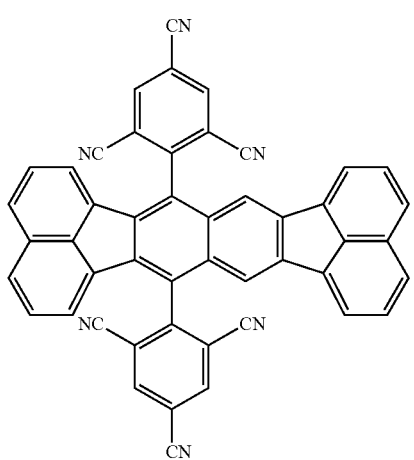
BD19
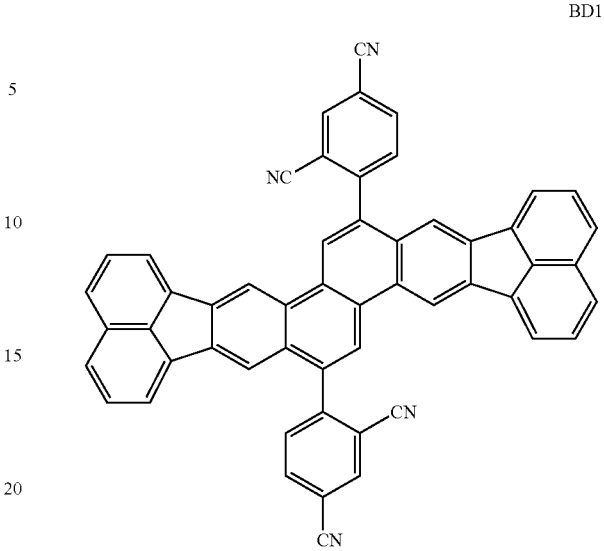
BD17
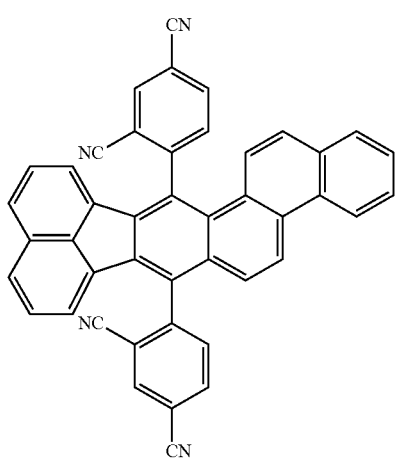
BD20
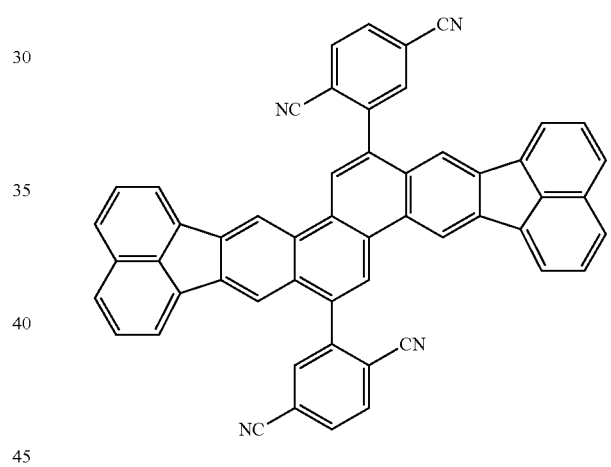
BD18
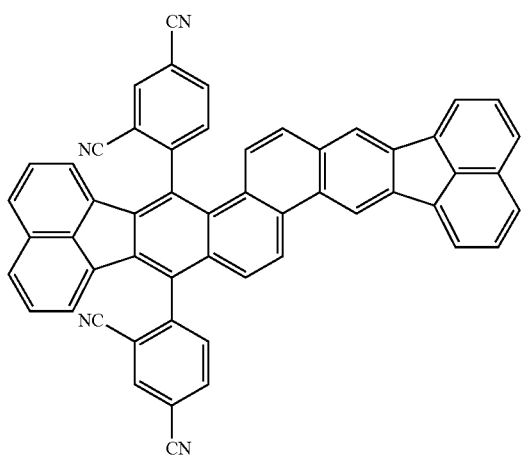
BD21
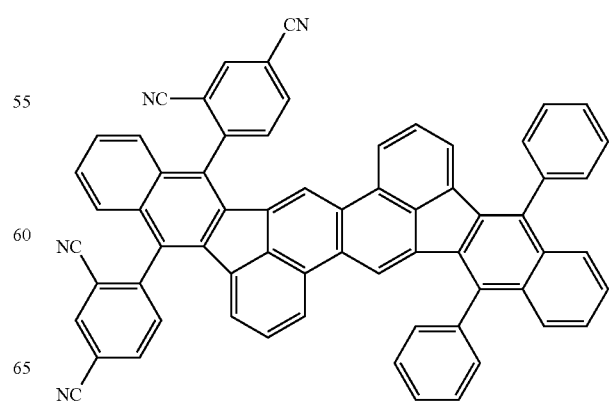

BD22
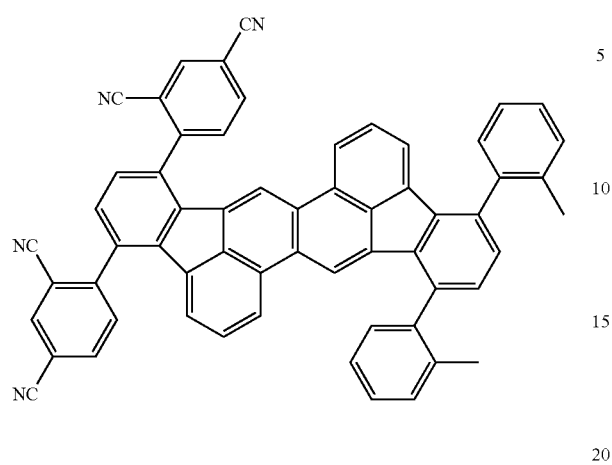
BD25
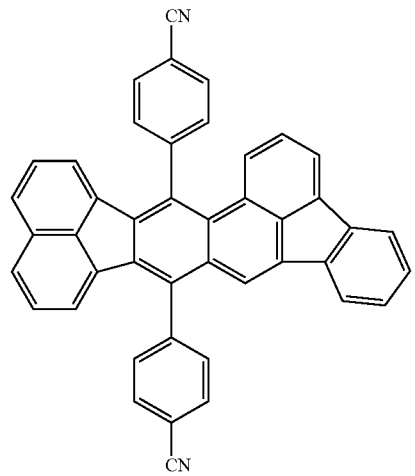
BD23
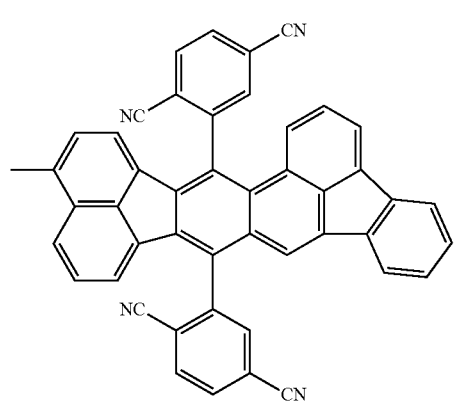
BD26
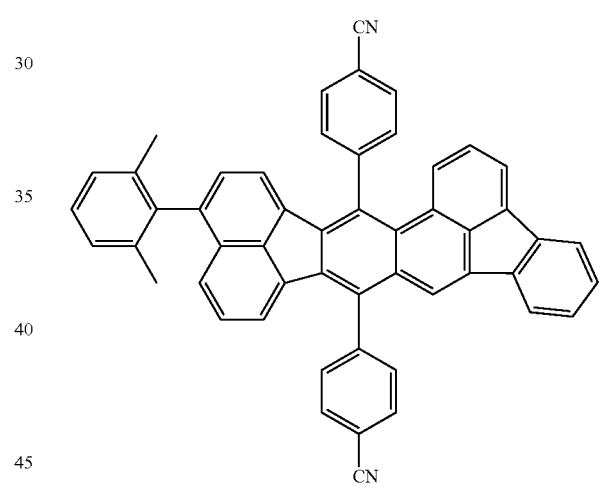
BD24
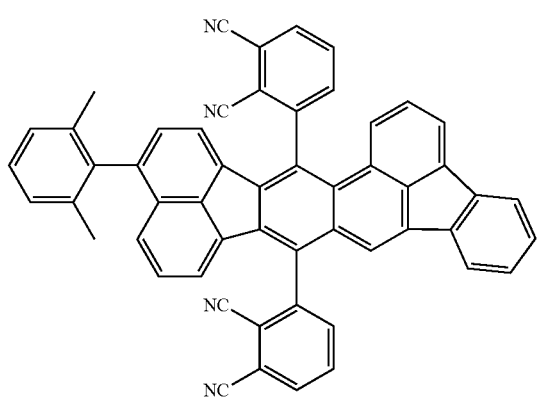
BD27
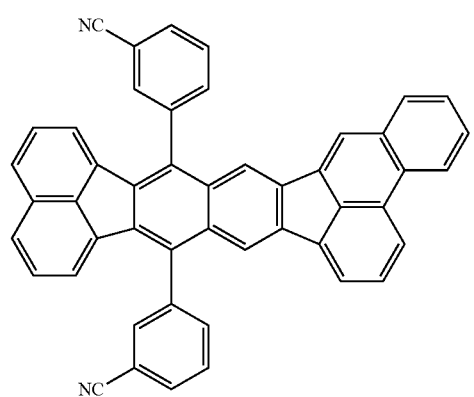

BD28
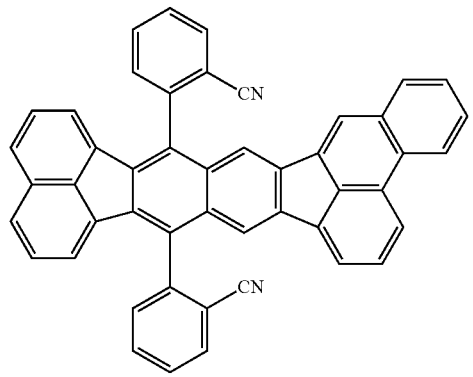
BD29
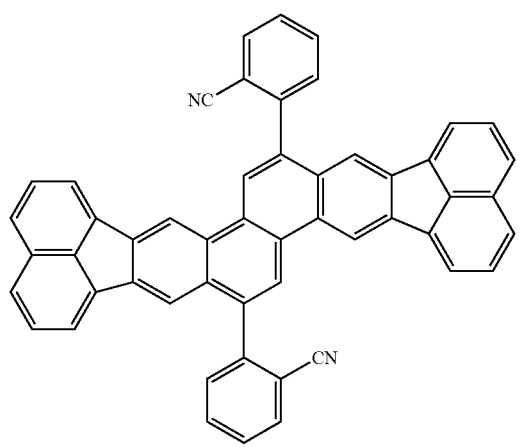
BD30
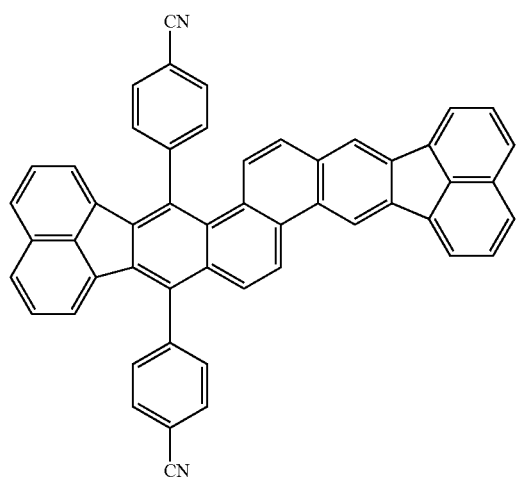
BD31
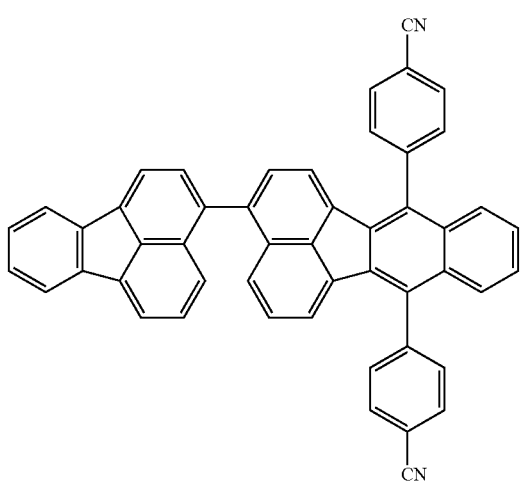
BD32
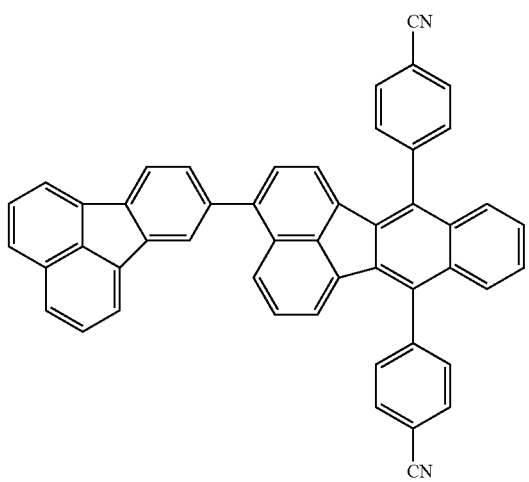
Specific examples of the first to third compounds used in an embodiment of the present disclosure are shown below. It is to be noted that these compounds are given by way of illustration and not by way of limitation.

EM1 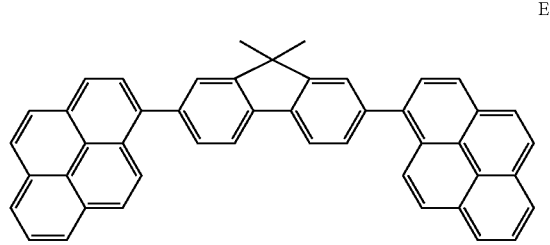
EM2 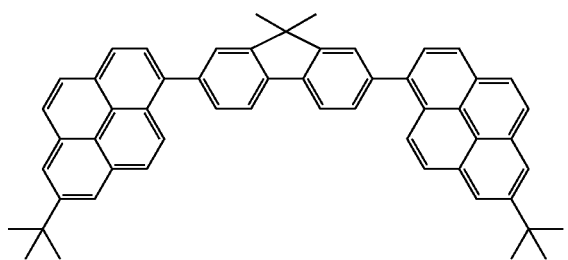
EM3 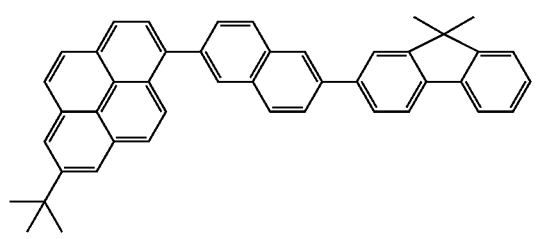
EM4 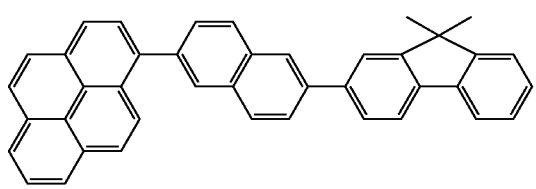
EM5 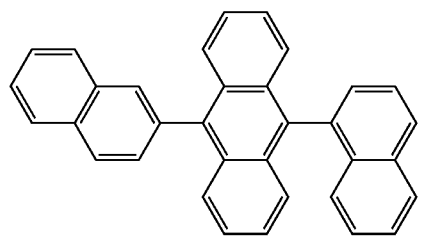
EM6 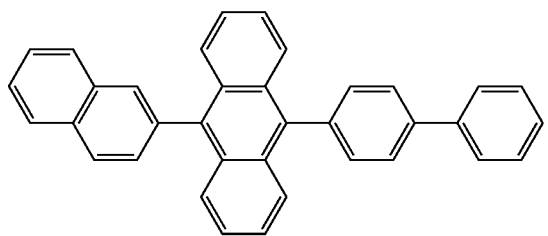
EM7 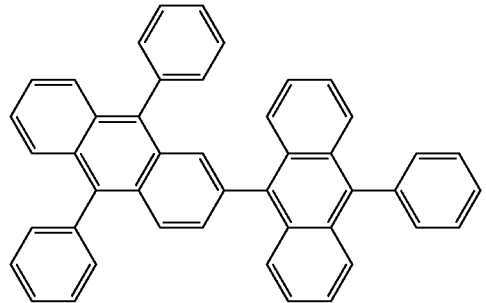
EM8 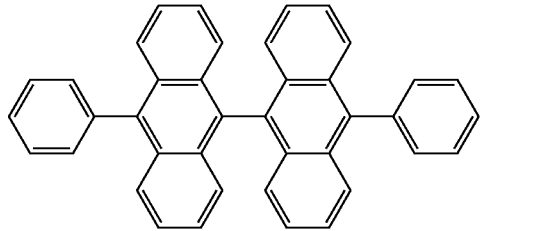
EM9 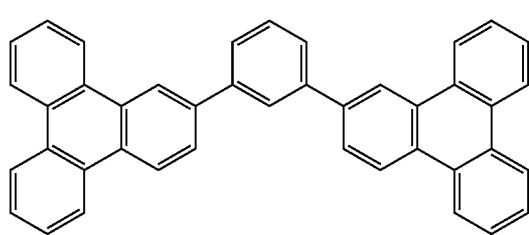
EM10 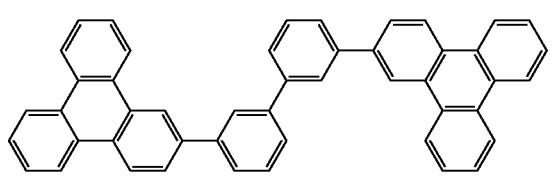
EM11 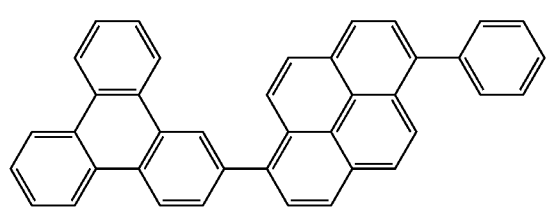
EM12 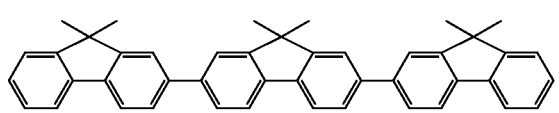

-continued
EM13
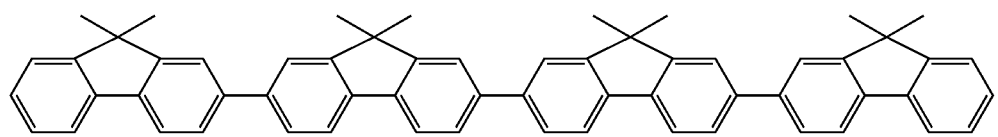
EM14
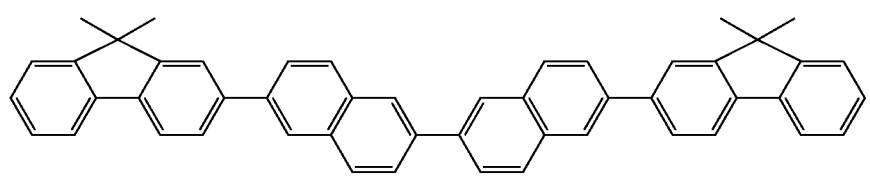
EM15 EM16
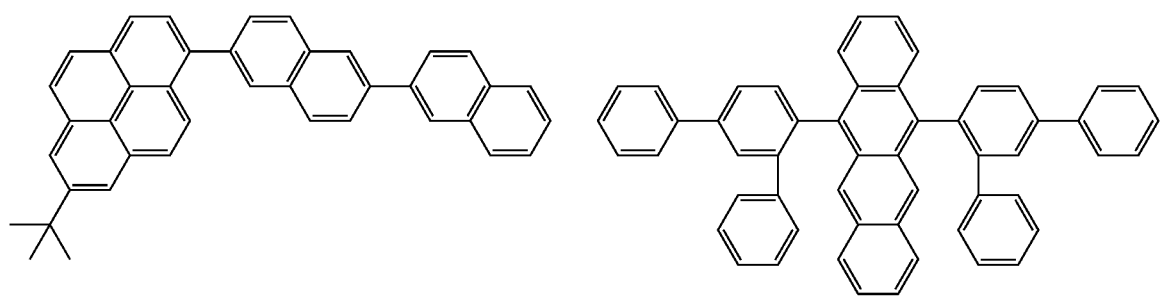
EM17 EM18
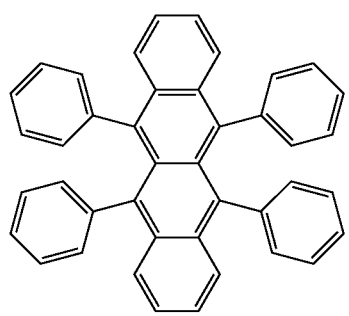
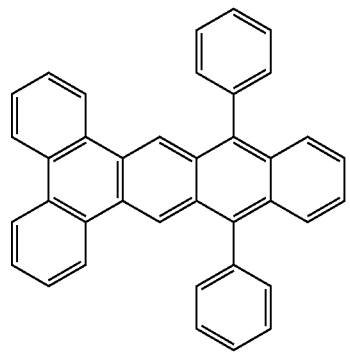
EM19 EM20
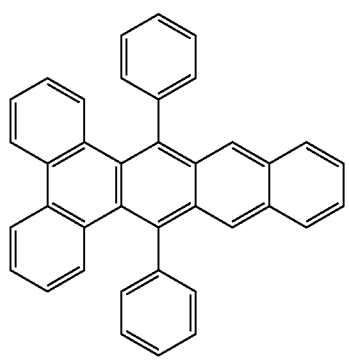
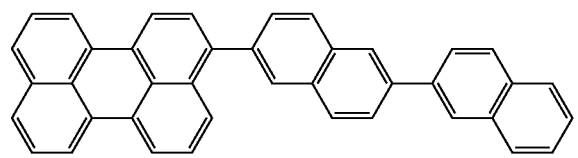

-continued
EM21
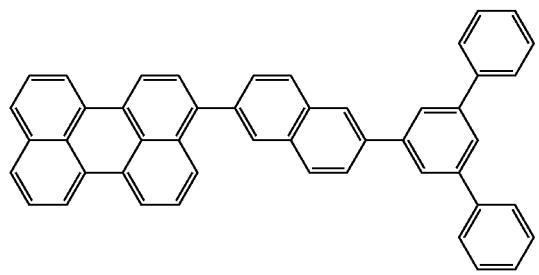
EM22
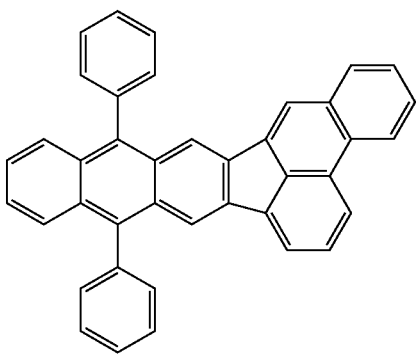
EM23
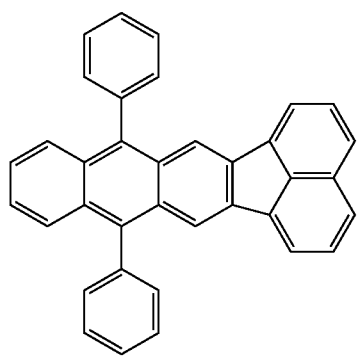
EM24
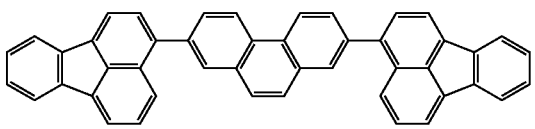
EM25
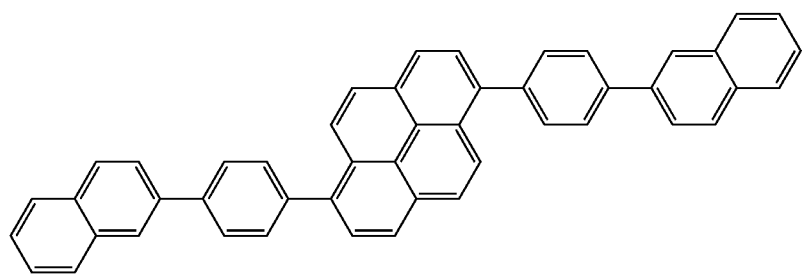
EM26
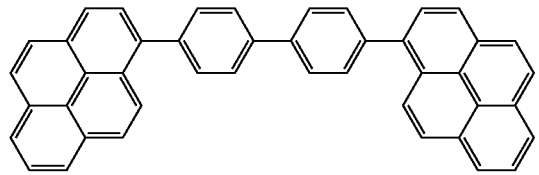
EM27
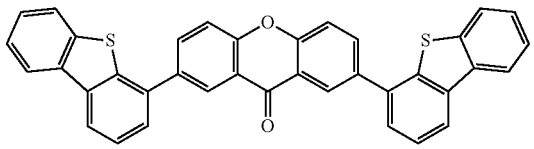
EM28
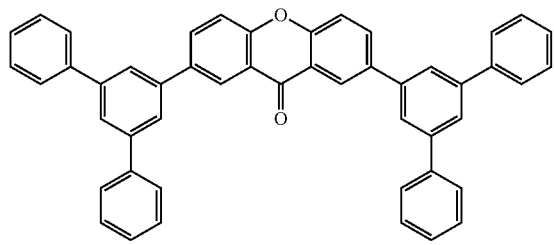
EM29
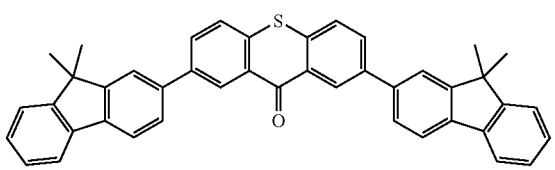

EM30
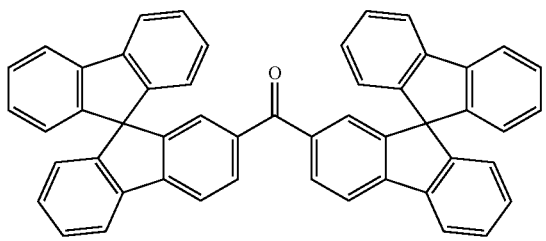

EM31
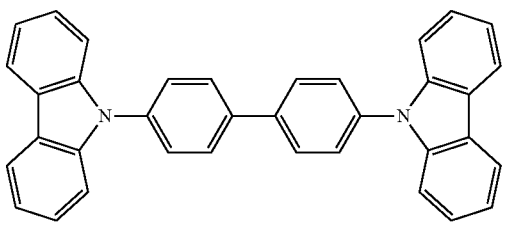

Among the compounds illustrated, EM1 to EM26, each consisting of a hydrocarbon, are preferred in terms of the binding stability described above. Using these compounds as hosts can provide an organic light emitting element with high durability. EM1 to EM4 and EM12 to EM15, each having an alkyl group, are more preferred. This is because the presence of an electron-donating alkyl group increases the LUMO level of the first compound, and thus the difference in LUMO level between the first compound and the light emitting material can be increased, that is, electron-trapping properties can be improved.

Examples of the blue-light emitting material according to an embodiment of the present disclosure other than BD1 to BD32 include the following compounds. When any of these blue-light emitting materials is used, a host material having a sufficiently high LUMO level may be selected.

BD35
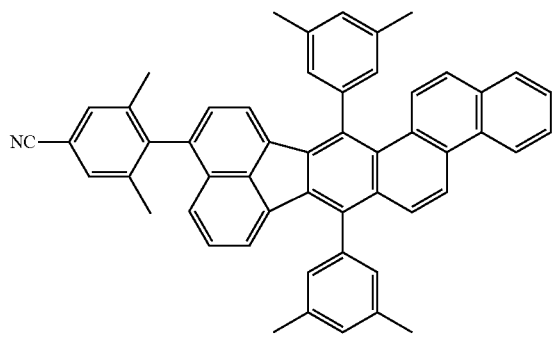

BD33
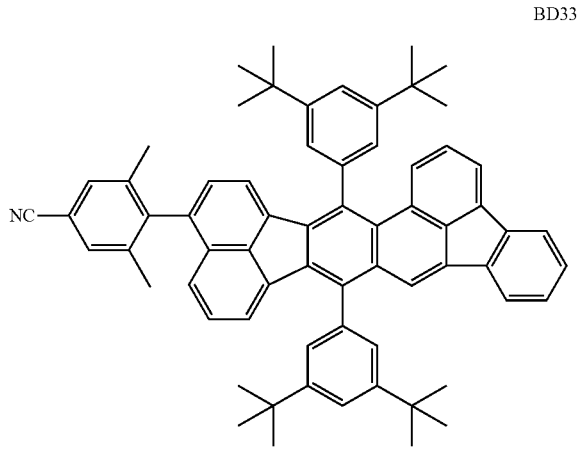

BD36
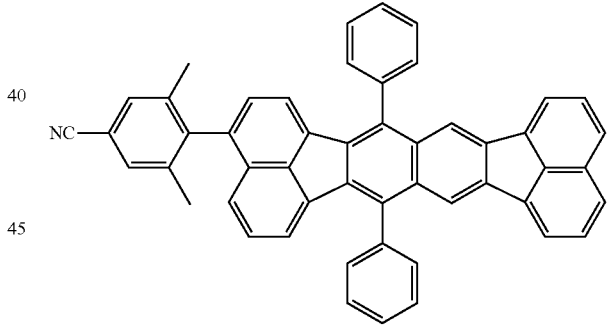

BD34
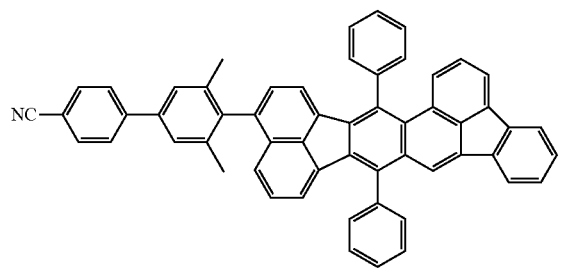

BD37
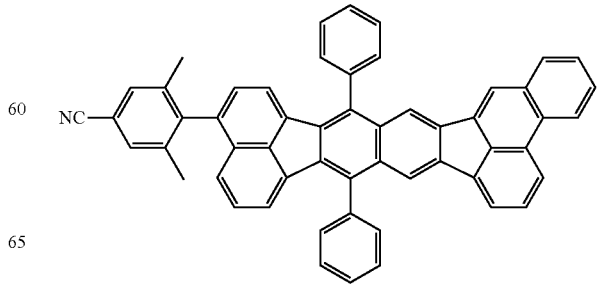

BD38
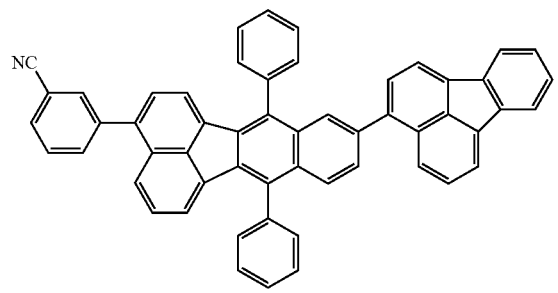
BD39
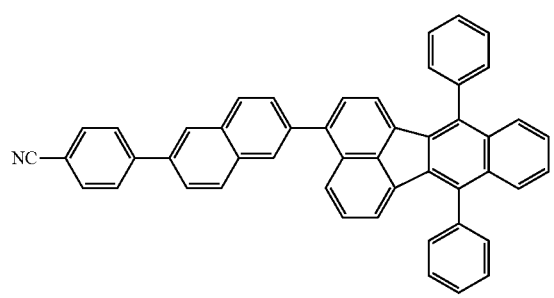
BD40
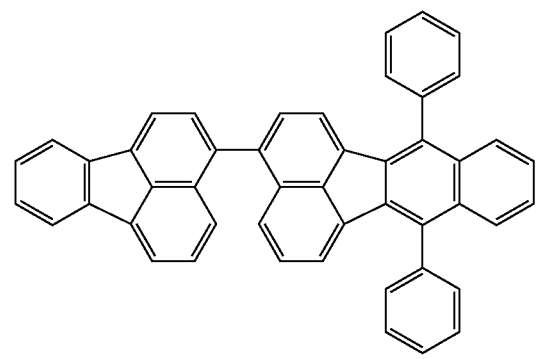
BD41
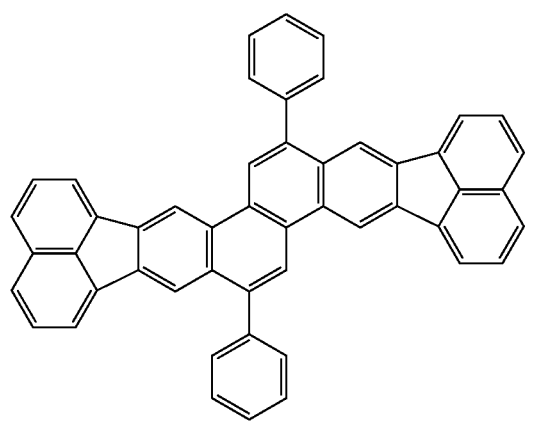
BD42
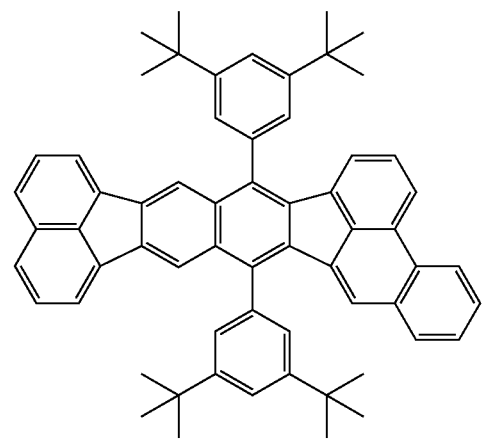
BD43
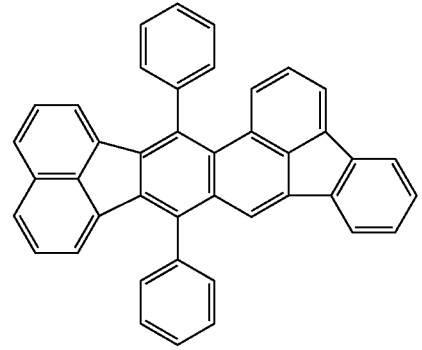
BD44
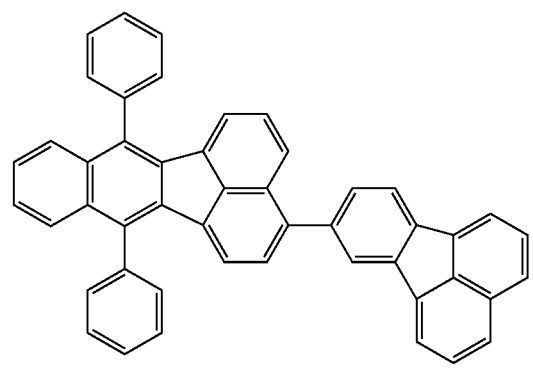
BD45
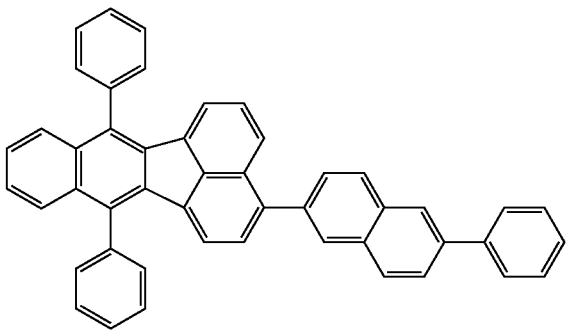

-continued
BD46
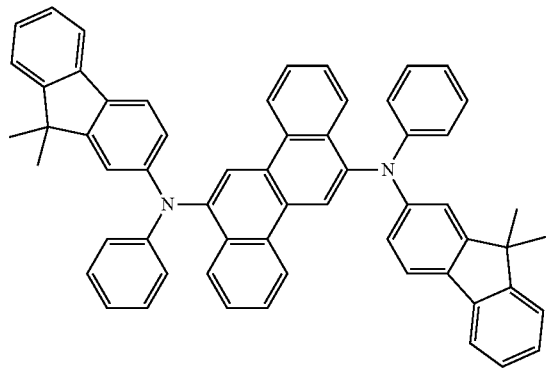
BD47
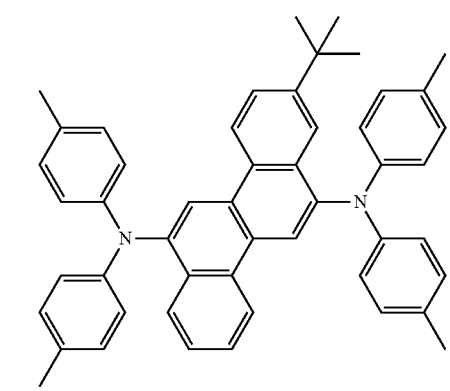
BD48
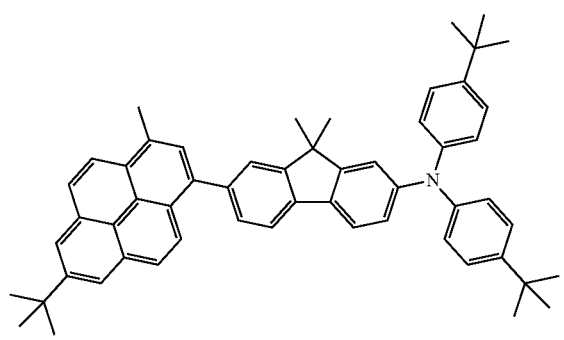
BD49
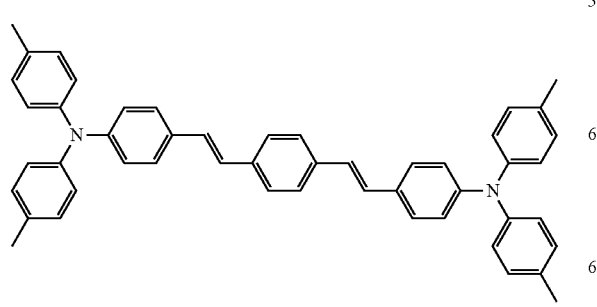
-continued
BD50
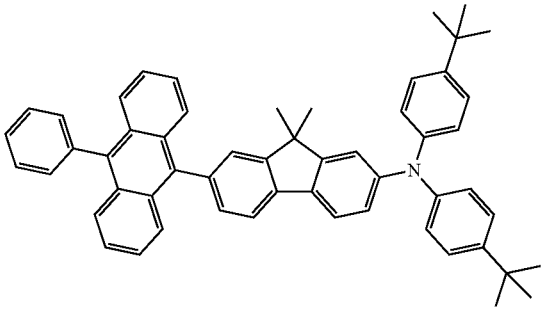
BD51
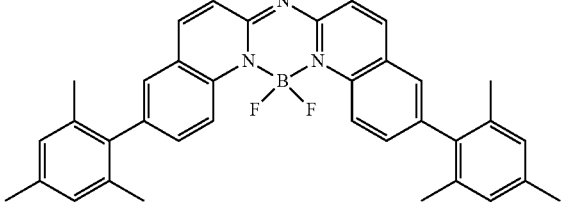
BD52
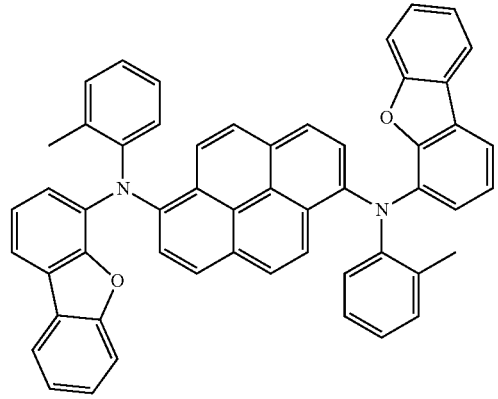
BD53

-continued

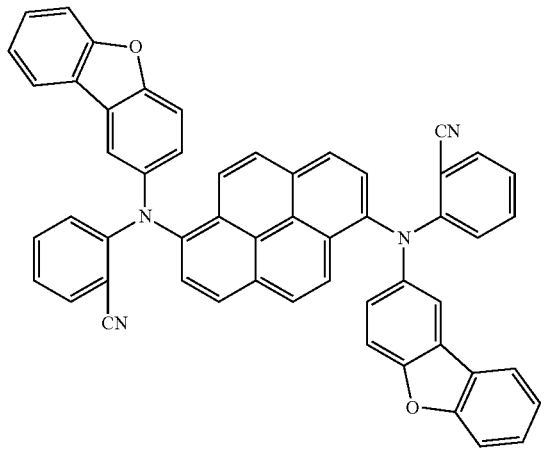
BD54

Among the blue-light emitting materials illustrated, compounds not having a substituted amino group, which has strong electron-donating properties, are preferred in terms of electron-trapping properties. Compounds having a cyano group, which has strong electron-withdrawing properties, are more preferred. The presence of a cyano group can lower the LUMO level of the light emitting material to improve the electron-trapping properties of the light emitting layer. The weight percentage of the blue-light emitting material in the light emitting layer is preferably 0.1 to 10.0 wt %, more preferably 0.3 to 5.0 wt %. At this concentration, concentration quenching and decrease in recombination probability are advantageously less likely to occur.

Examples of the green-light emitting material according to an embodiment of the present disclosure include the following compounds, but are not limited thereto.

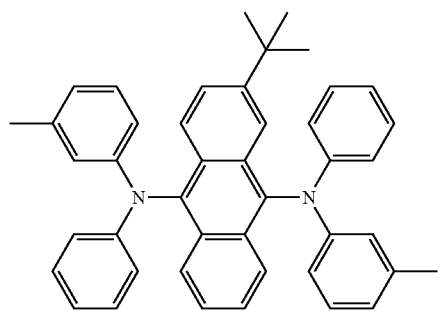
GD1

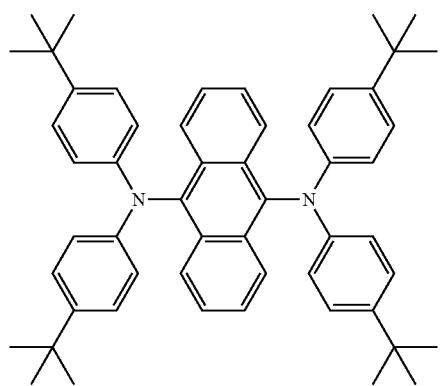
GD2

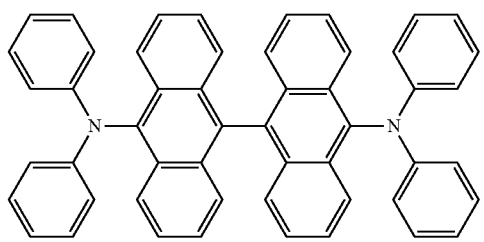
GD3

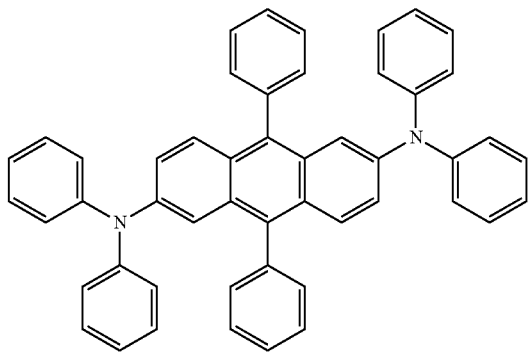
GD4

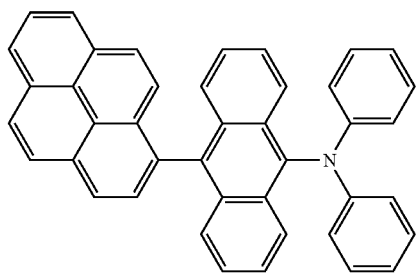
GD5

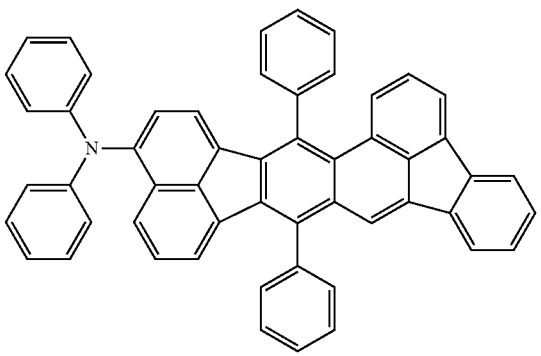
GD6

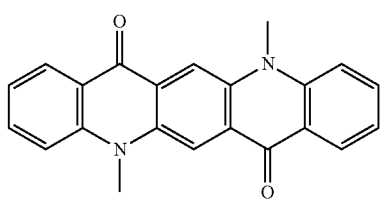
GD7

-continued

GD8

GD9

GD10

GD11

-continued

GD12

GD13

GD14

GD15
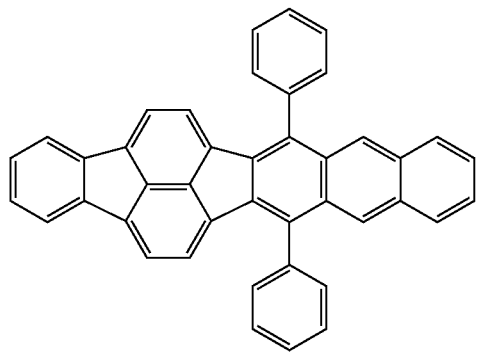
GD19
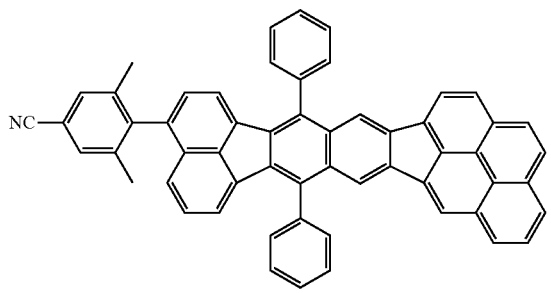
GD16
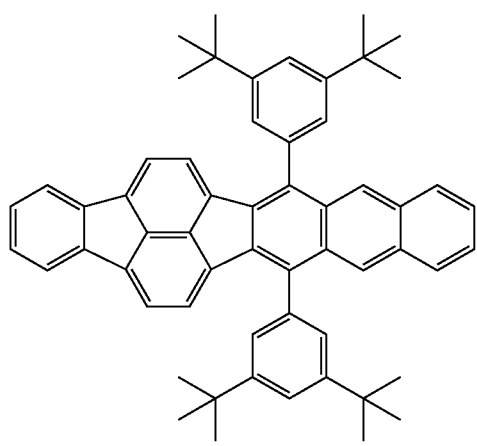
GD20
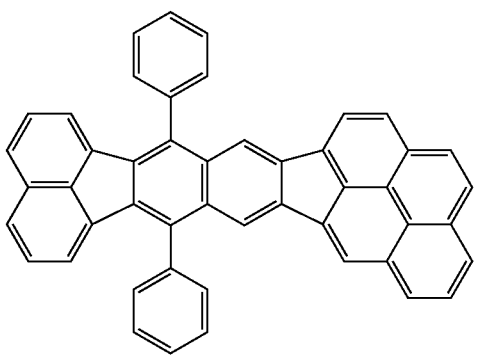
GD17
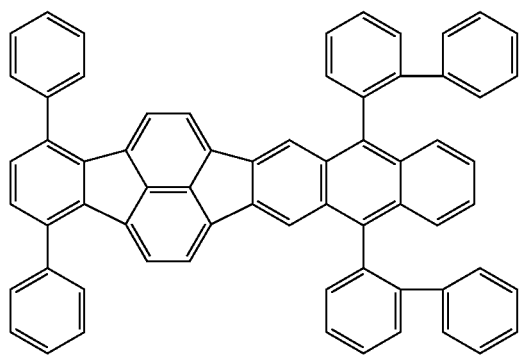
GD21
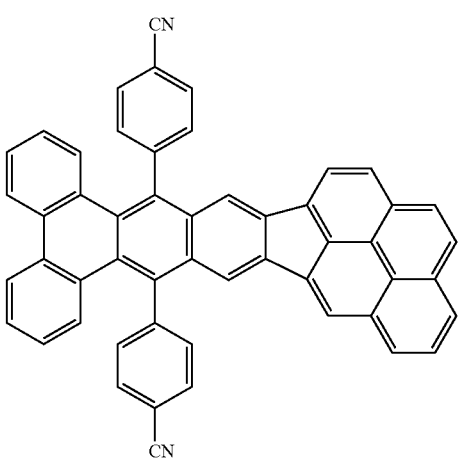
GD18
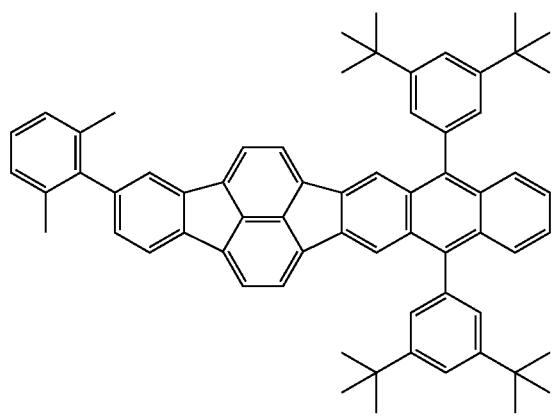
GD22
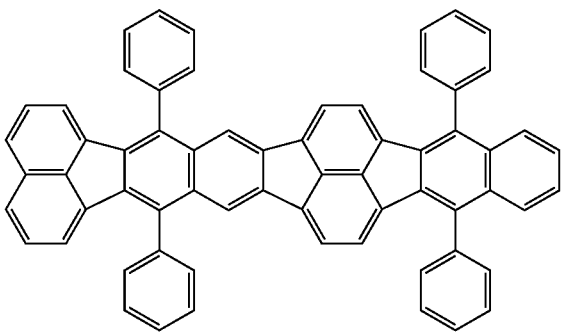

-continued
GD23
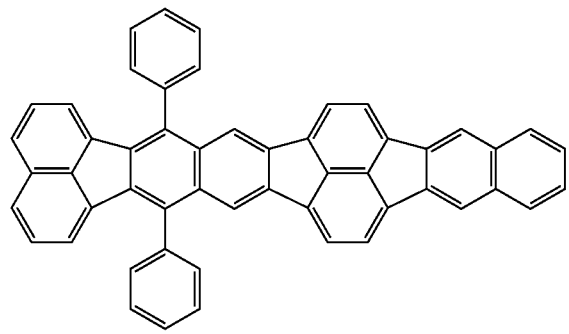
GD24
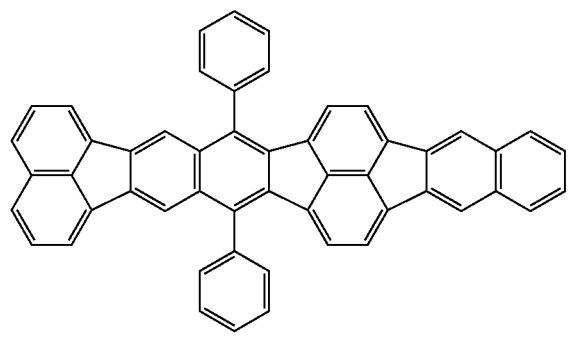
GD25
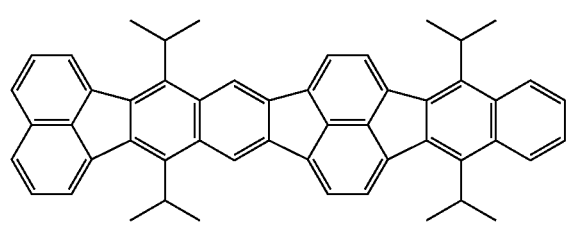
GD26
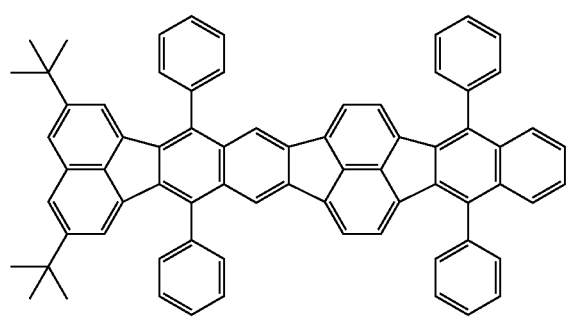
-continued
GD27
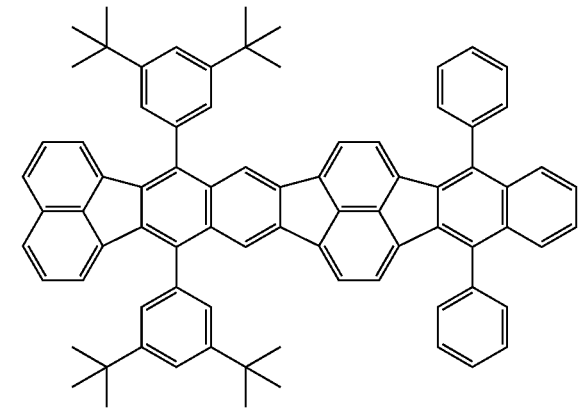
GD28
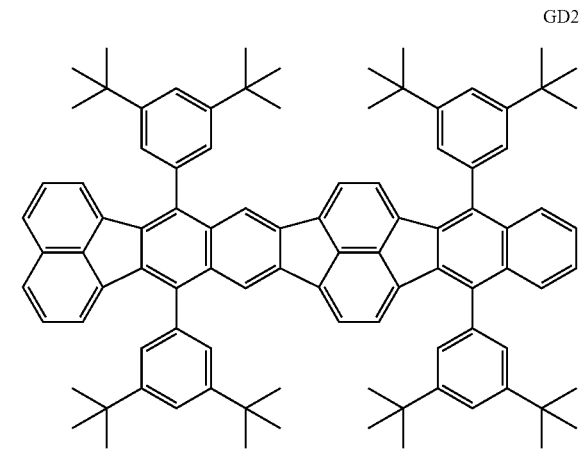
GD29
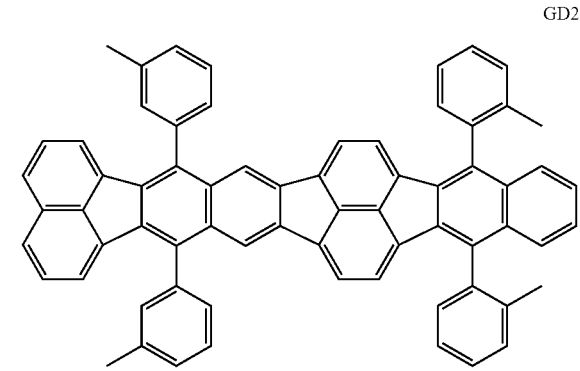
GD30
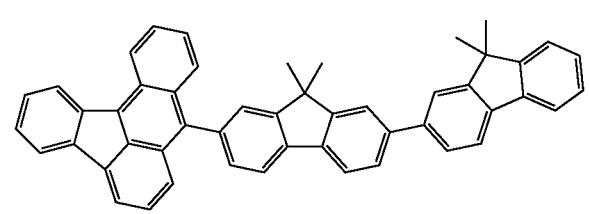

GD31

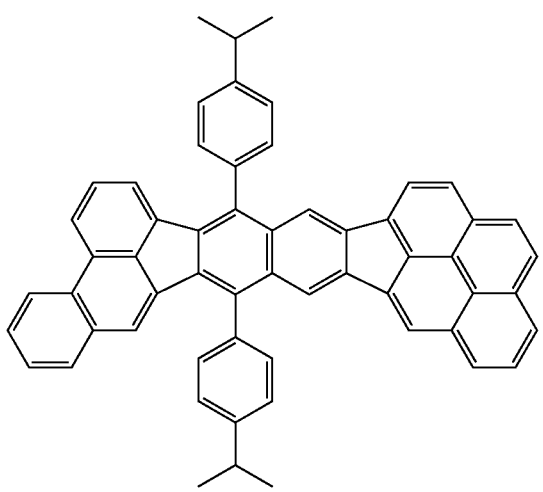

GD32

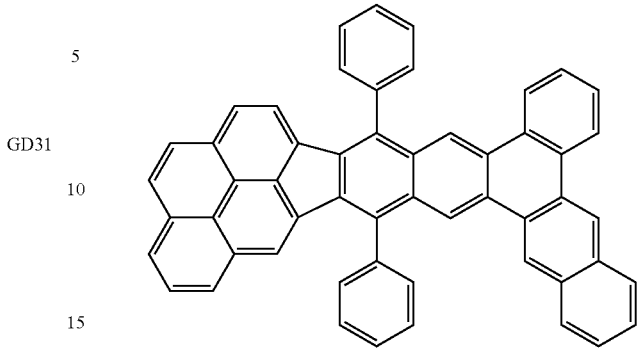

Among the green-light emitting materials illustrated, compounds not having a substituted amino group, which has strong electron-donating properties, are preferred in terms of electron-trapping properties. The weight percentage of the green-light emitting material in the light emitting layer is preferably 0.1 to 10.0 wt %, more preferably 0.3 to 5.0 wt %. At this concentration, concentration quenching and decrease in recombination probability are advantageously less likely to occur.

Examples of the red-light emitting material according to an embodiment of the present disclosure include the following compound, but are not limited thereto.

RD1

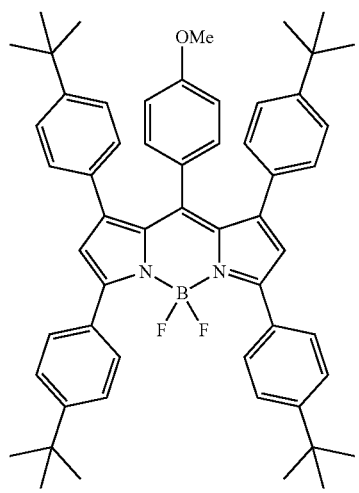

RD2

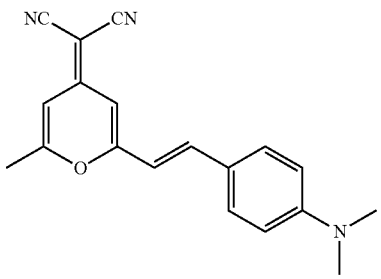

RD3

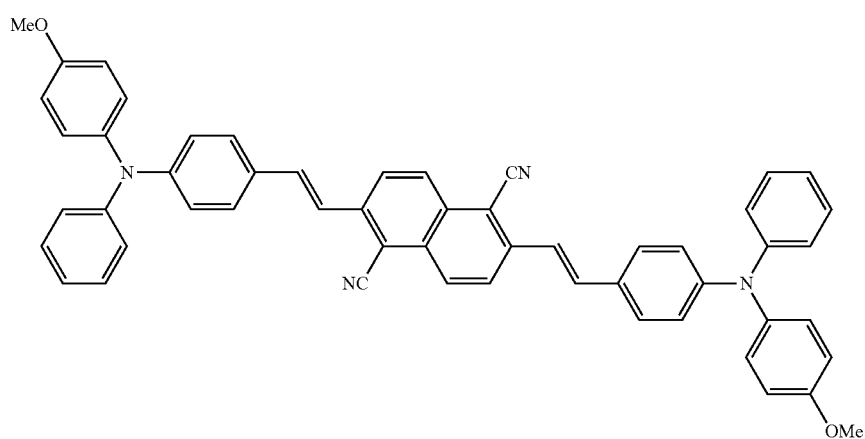

-continued
RD4
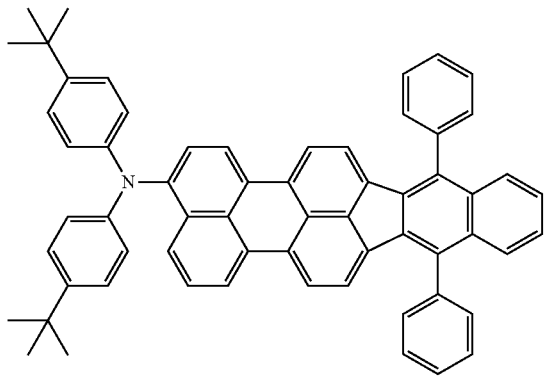
RD5
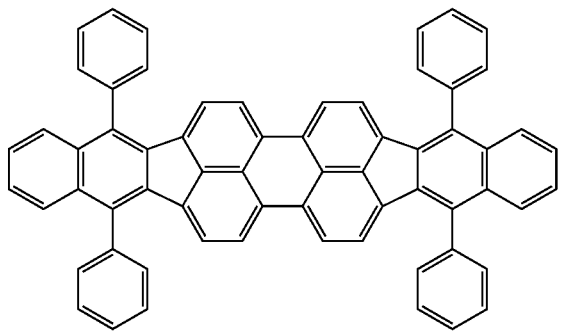
RD6
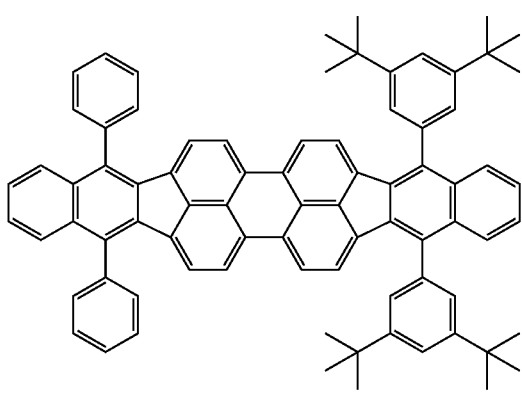
RD7
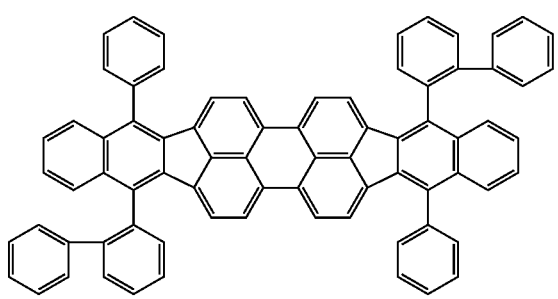
RD8
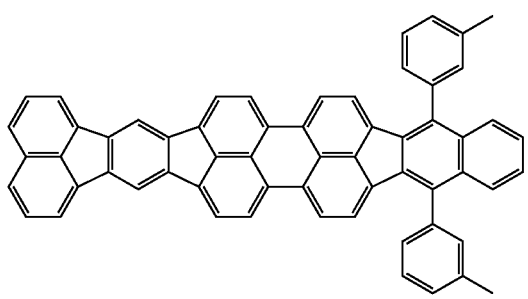
RD9
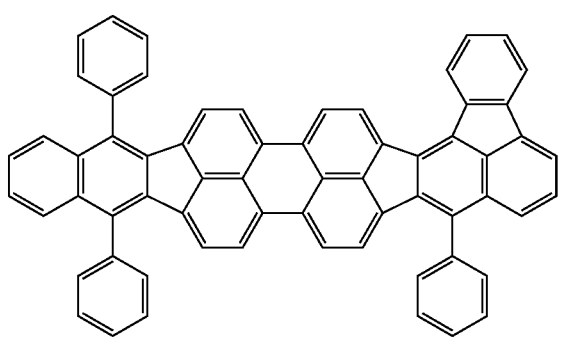
RD10
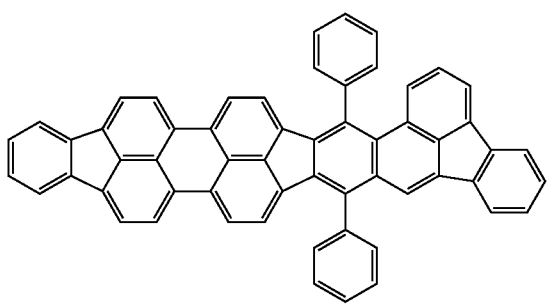
RD11
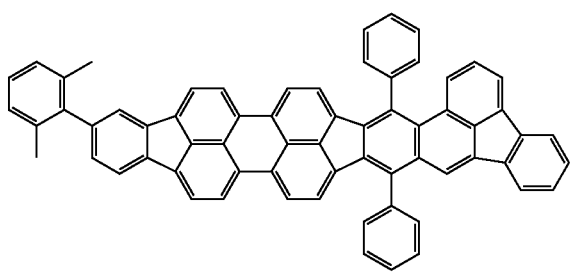

-continued
RD12
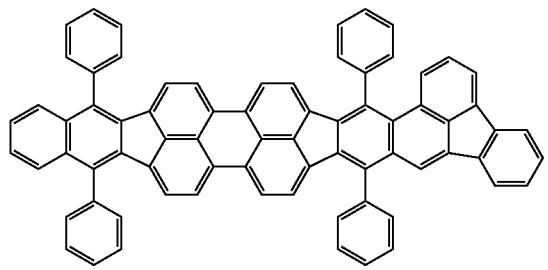
RD13
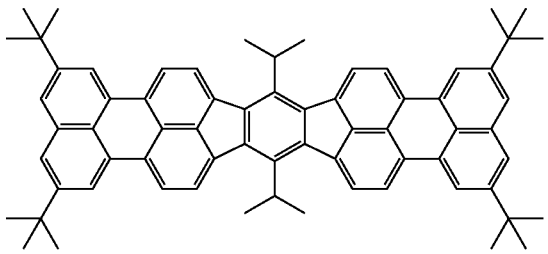
RD14
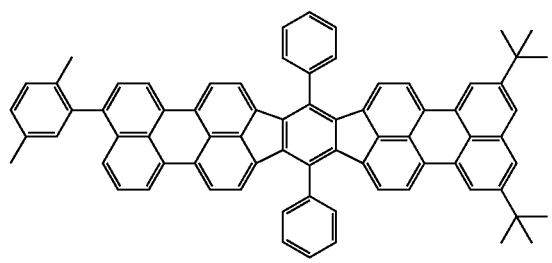
RD15
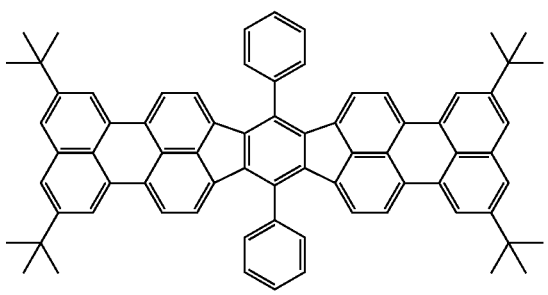
RD16
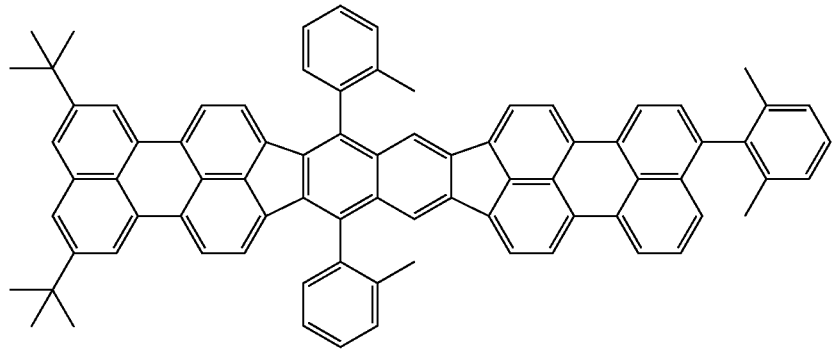
RD17
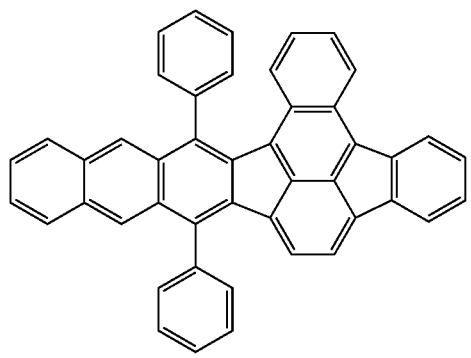
RD18
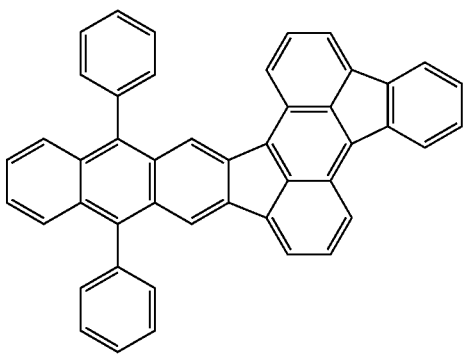
RD19
RD20
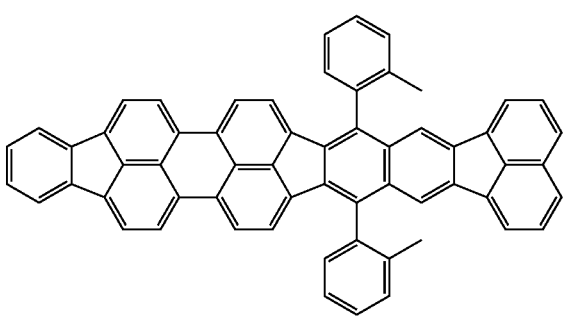

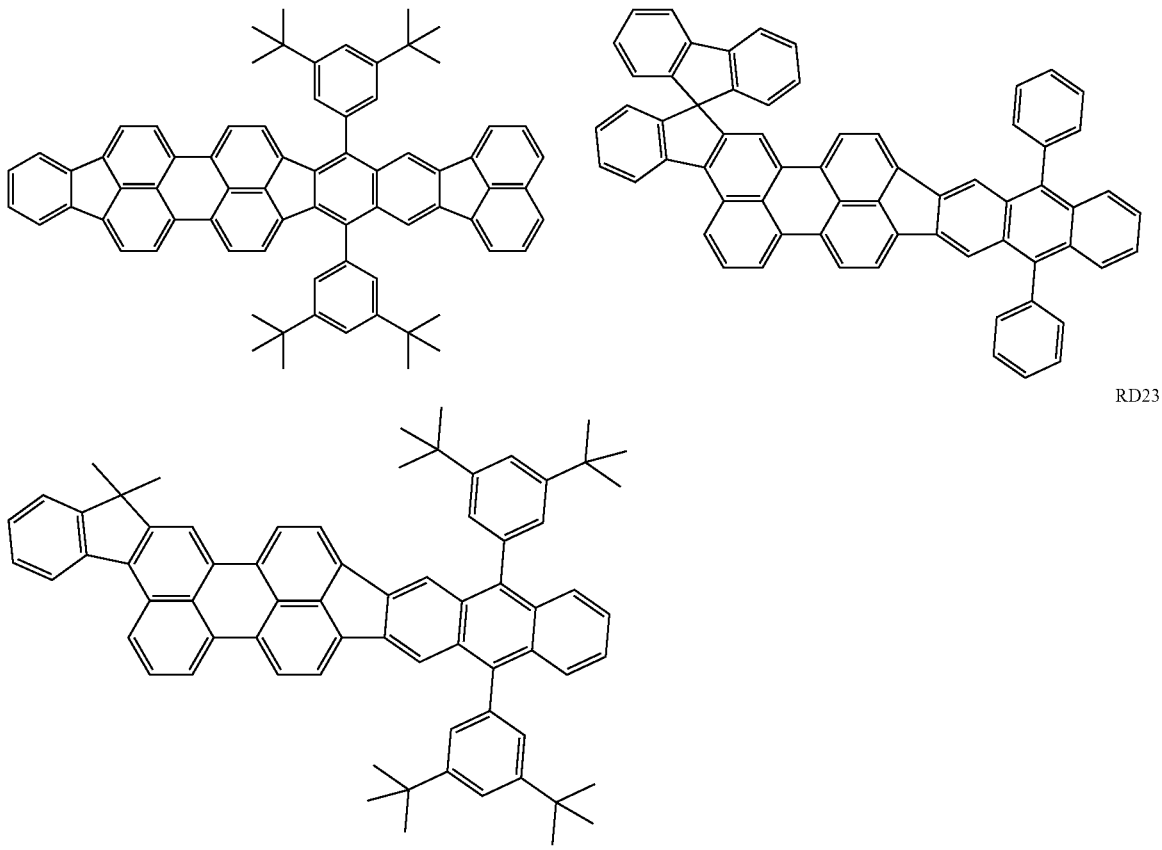

Among the red-light emitting materials illustrated, compounds consisting of a hydrocarbon are preferred in terms of binding stability. The weight percentage of the red-light emitting material in the light emitting layer is preferably 0.1 to 5.0 wt %, more preferably 0.1 to 0.5 wt %. At this concentration, concentration quenching and decrease in recombination probability are advantageously less likely to occur.

In an embodiment of the present disclosure, in addition to the blue-light emitting materials, the green-light emitting materials, and the red-light emitting material described above, condensed-ring compounds (e.g., fluorene derivatives, naphthalene derivatives, pyrene derivatives, perylene derivatives, tetracene derivatives, anthracene derivatives, and rubrene), quinacridone derivatives, coumarin derivatives, stilbene derivatives, organic aluminum complexes such as tris(8-quinolinolato)aluminum, iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives may also be used.

An organic light emitting element according to an embodiment of the present disclosure includes an anode that is a first electrode, a cathode that is a second electrode, and an organic compound layer (organic EL layer) disposed between the anode and the cathode. The organic compound layer includes, from the anode side, a first light emitting layer and a second light emitting layer. In the present disclosure, a hole transport layer may be disposed between the anode and the first light emitting layer, and in addition, a hole injection layer may be disposed between the anode and the hole transport layer. In addition, an electron blocking layer may be disposed between the hole transport layer and the first light emitting layer. An electron transport layer may be disposed between the cathode and the second light emitting layer, and in addition, an electron injection layer may be disposed between the cathode and the electron transport layer. A hole blocking layer may be disposed between the electron transport layer and the second light emitting layer.

In particular, the structure including both the hole transport layer with the electron blocking layer and the electron transport layer with the hole blocking layer enables trapping of both carriers, that is, holes and electrons, in the light emitting layers and thus can provide a light emitting element that undergoes no carrier leakage and emits light with high efficiency.

Various other layer structures may be employed, for example: an insulating layer may be disposed at the interface between an electrode and an organic compound layer; an adhesive layer or an interference layer may be disposed; the electron transport layer or the hole transport layer may be composed of two layers having different ionization potentials; or the light emitting layer may be composed of two layers made of different light emitting materials.

An organic light emitting element according to an embodiment of the present disclosure may be of bottom-emission type in which light is emitted from the electrode on the element-supporting substrate side or of top-emission type in which light is emitted from the side opposite the substrate, or may be configured to emit light from both sides.

As hole injection and transport materials used for the hole transport layer and the hole injection layer described above, materials that can facilitate injection of holes from the anode and materials that have so high hole mobility that enables injected holes to be transported to the light emitting layer may be used. To reduce deterioration of film quality, such as crystallization, in the organic light emitting element, materials having high glass-transition temperatures may be used.

Examples of low-molecular-weight and high-molecular-weight materials having hole injection and transport properties include triarylamine derivatives, arylcarbazole derivatives, phenylenediamine derivatives, stilbene derivatives, phthalocyanine derivatives, porphyrin derivatives, poly(vinylcarbazole), poly(thiophene), and other conductive polymers. These hole injection and transport materials are also suitable for use in the electron blocking layer.

Non-limiting specific examples of compounds usable as hole injection and transport materials are shown below.

HT1
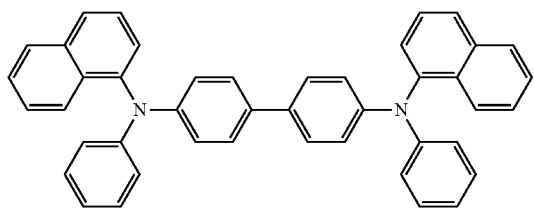

HT2
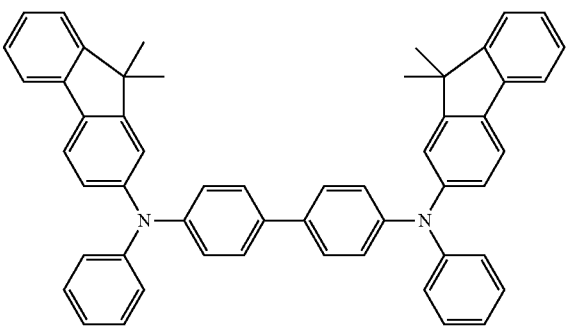

HT3
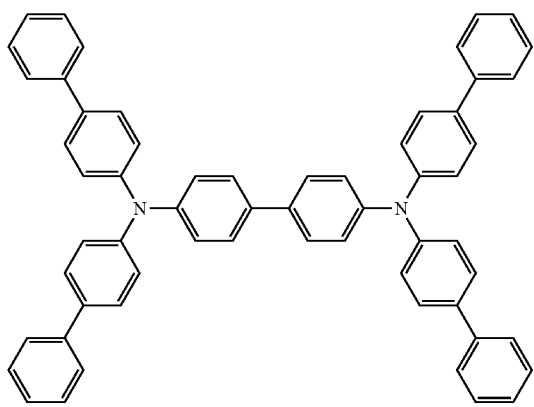

HT4
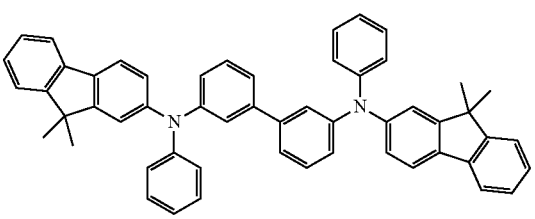

HT5
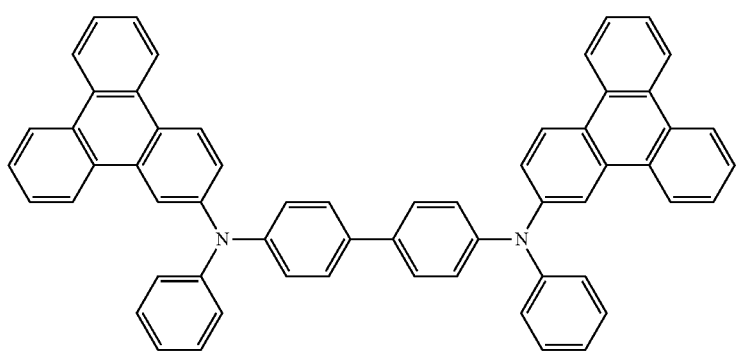

-continued
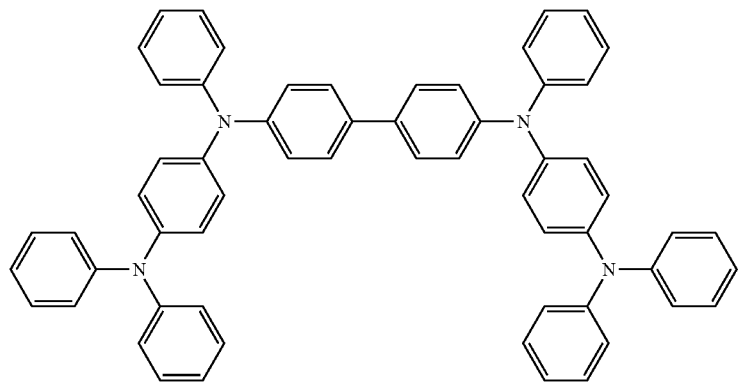
HT6
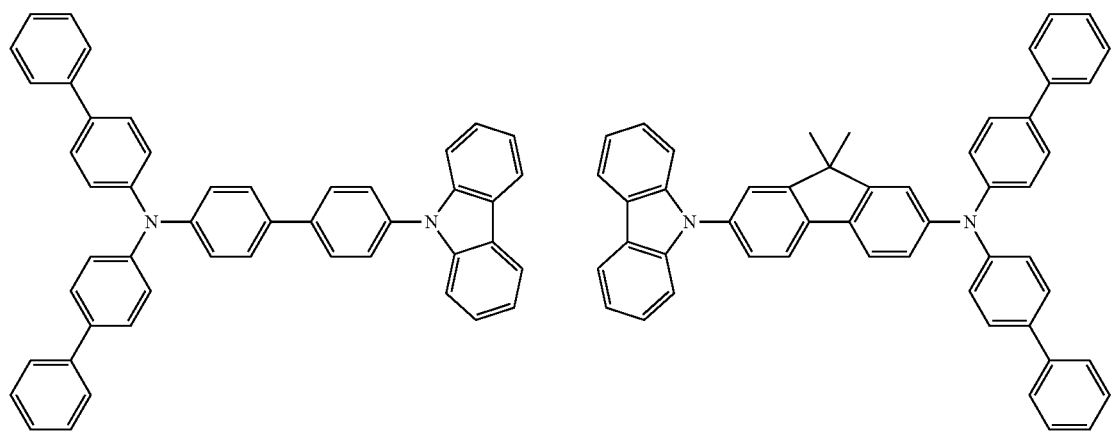
HT7  HT8
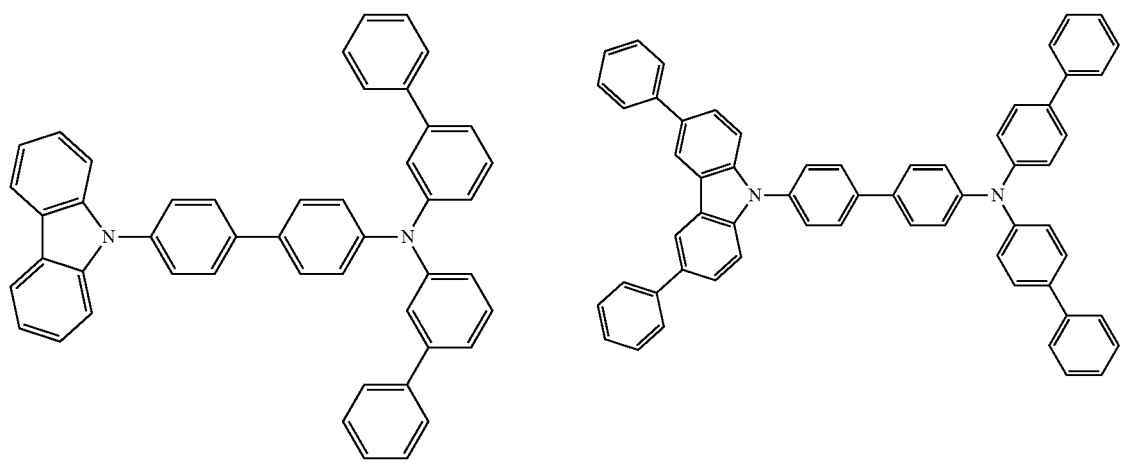
HT9  HT10

-continued
HT11
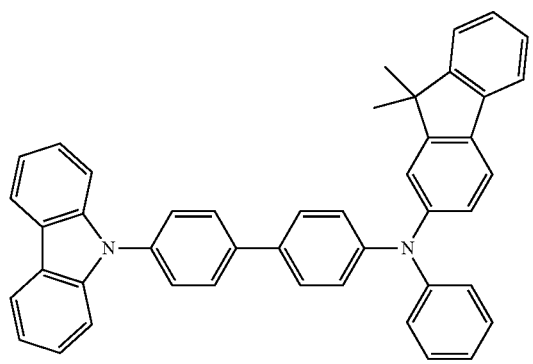
HT12
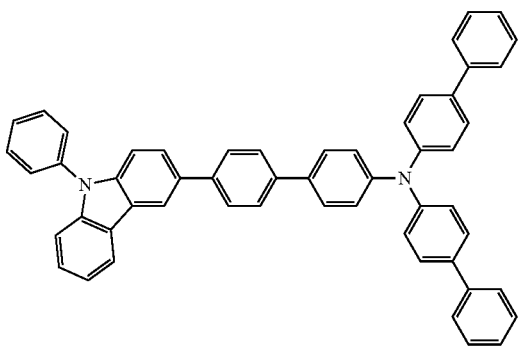
HT13
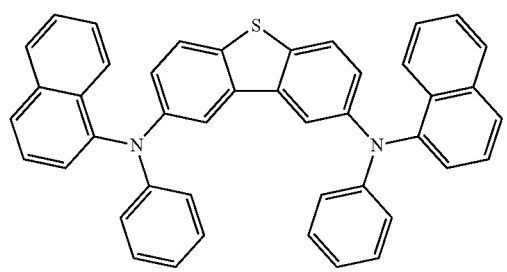
HT14
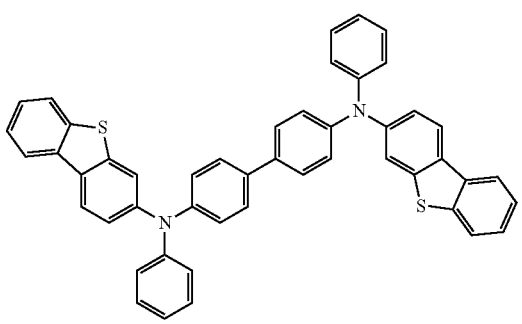
HT15
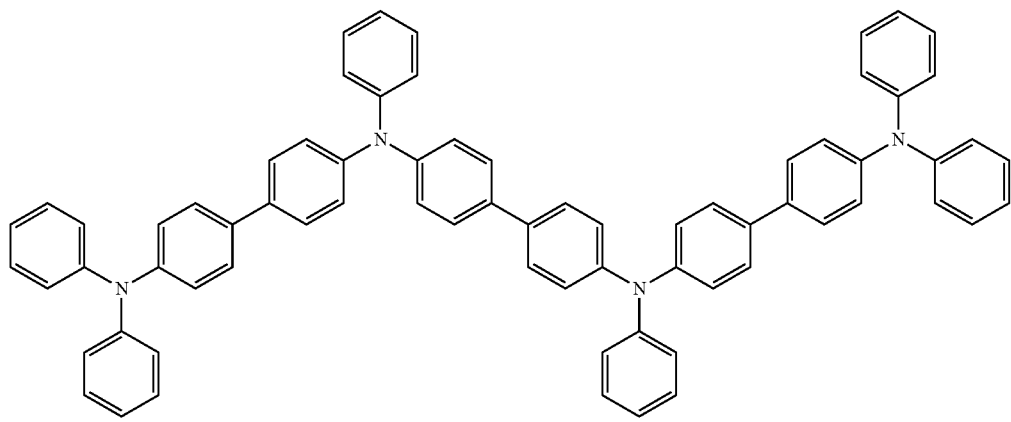
HT16
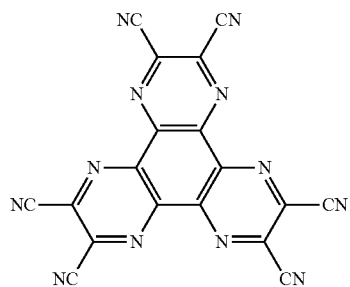
HT17
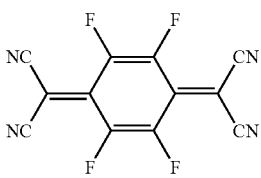

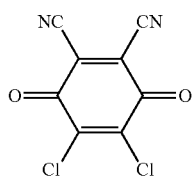

HT18

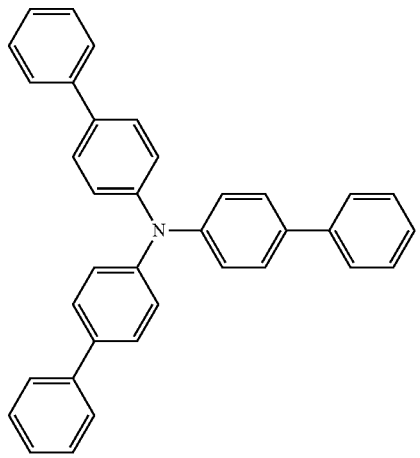

HT19

Any electron transport material capable of transporting electrons injected from the cathode to the light emitting layer can be freely selected taking into account, for example, the balance with the hole mobility of a hole transport material. Examples of materials capable of transporting electrons include oxadiazole derivatives, oxazole derivatives, pyrazine derivatives, triazole derivatives, triazine derivatives, quinoline derivatives, quinoxaline derivatives, phenanthroline derivatives, organic aluminum complexes, and condensed-ring compounds (e.g., fluorene derivatives, naphthalene derivatives, chrysene derivatives, and anthracene derivatives). These electron transport materials are also suitable for use for the hole blocking layer.

Non-limiting specific examples of compounds usable as electron transport materials are shown below.

ET1

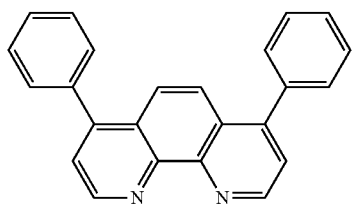

ET2

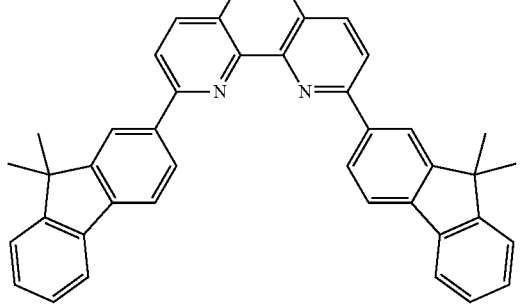

ET3

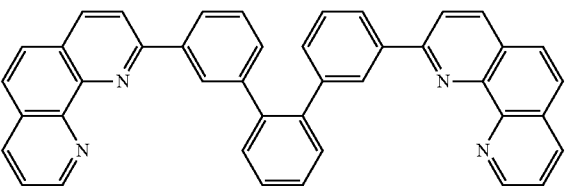

ET4

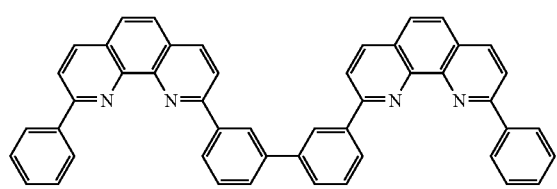

ET5

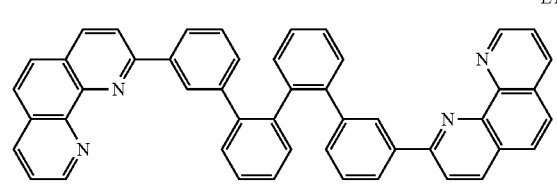

ET6

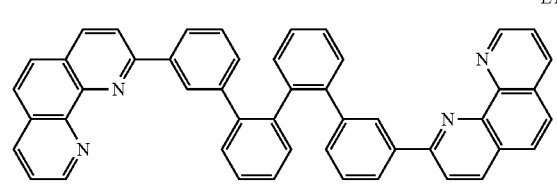

ET7
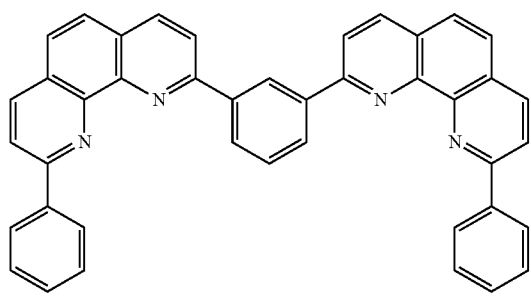
ET8
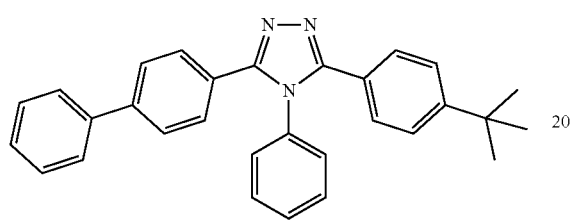
ET9
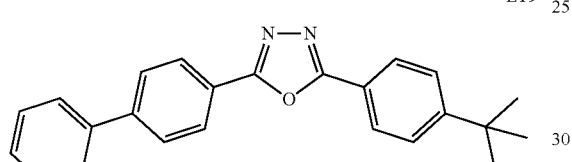
ET10
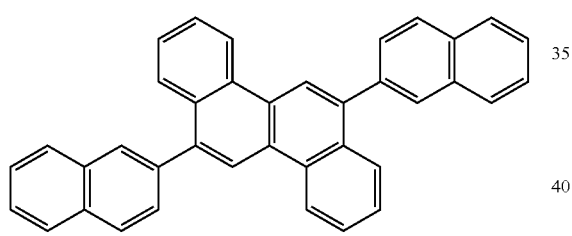
ET11
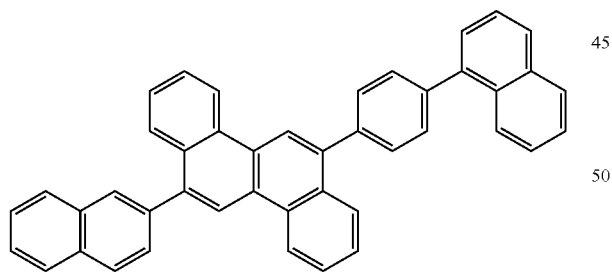
ET12
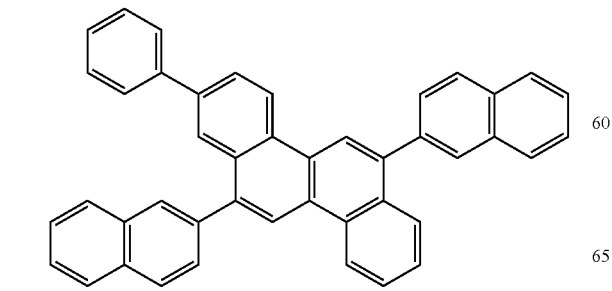
ET13
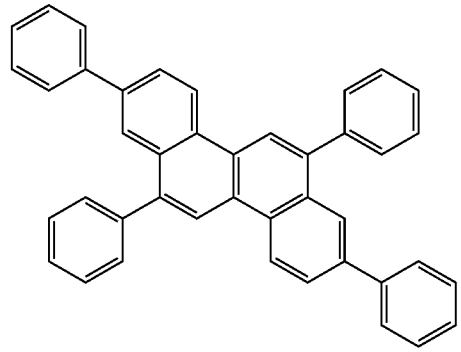
ET14
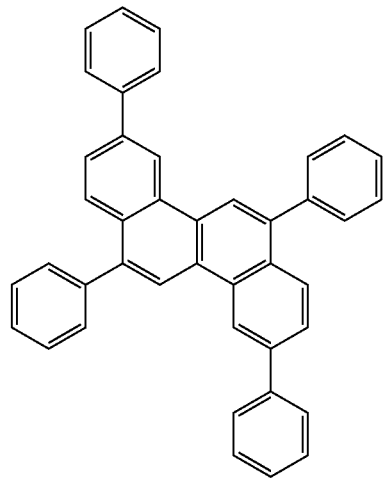
ET15
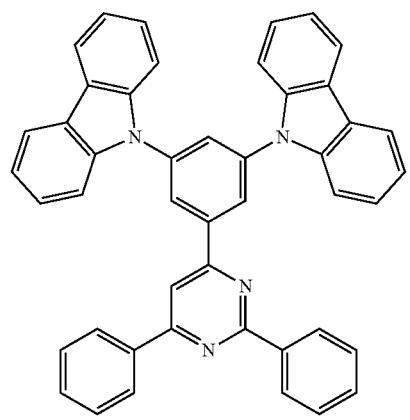

-continued

ET16
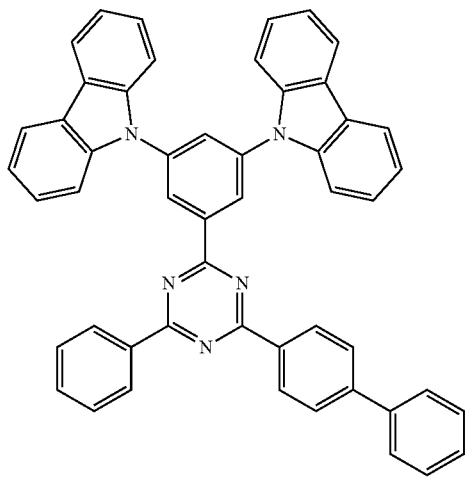

ET17
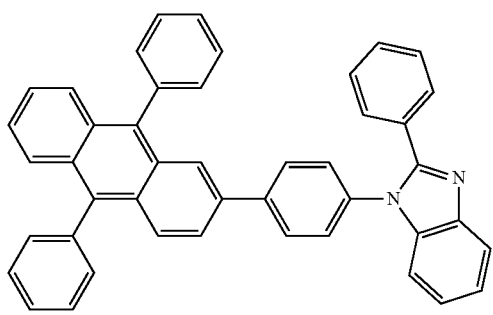

ET18
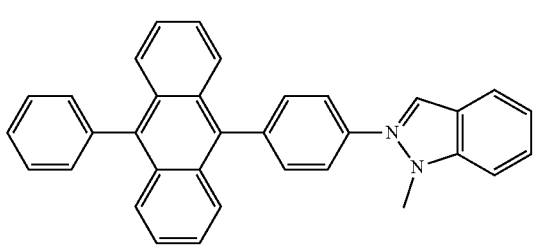

ET19

-continued

ET20
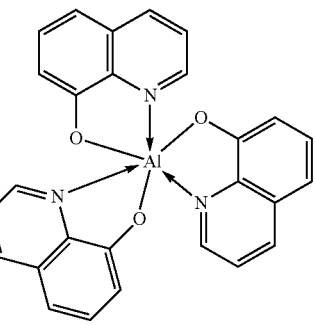

ET21
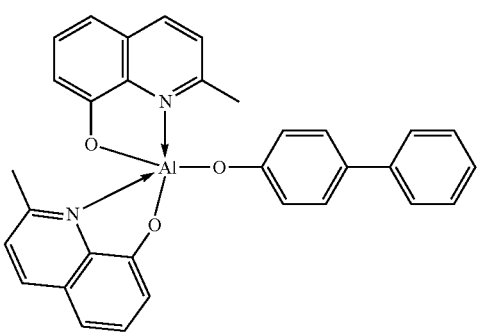

ET22
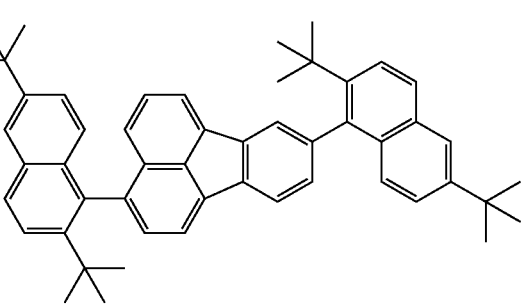

ET23

Configuration of Organic Light Emitting Element

An organic light emitting element includes a substrate and an anode, an organic compound layer, and a cathode formed on the substrate. A protective layer, a color filter, and the like may be disposed on the cathode. When the color filter is disposed, a planarization layer may be disposed between the color filter and the protective layer. The planarization layer may be formed of an acrylic resin or the like.

Substrate

The substrate may be made of, for example, quartz, glass, a silicon wafer, a resin, or a metal. The substrate may have lines and switching elements such as transistors disposed thereon, and an insulating layer may be disposed thereon. The insulating layer may be made of any material as long as a contact hole can be formed therein to provide an electrical connection between the anode 2 and a line and insulation for an unconnected line can be provided. The insulating layer may also serve as a planarization layer that planarizes the irregularities of the substrate. For example, resins such as polyimide, silicon oxide, and silicon nitride can be used.

Electrodes

The electrodes may be a pair of electrodes. The pair of electrodes may be an anode and a cathode. When an electric field is applied in a direction in which the organic light emitting element emits light, one of the electrodes at a higher potential is the anode, and the other is the cathode. Stated another way, one of the electrodes that supplies holes to the light emitting layer is the anode, and the other electrode that supplies electrons to the light emitting layer is the cathode.

The anode may be made of a material having a work function as high as possible. For example, elemental metals such as gold, platinum, silver, copper, nickel, palladium, cobalt, selenium, vanadium, and tungsten, mixtures containing these metals, alloys of these metals, and metal oxides such as tin oxide, zinc oxide, indium oxide, indium tin oxide (ITO), and indium zinc oxide can be used. Conductive polymers such as polyaniline, polypyrrole, and polythiophene can also be used.

These electrode materials can be used alone or in combination. The anode may be formed of a single layer or multiple layers.

When the anode is used as a reflection electrode, chromium, aluminum, silver, titanium, tungsten, molybdenum, an alloy thereof, or a laminate thereof can be used, for example. When the anode is used as a transparent electrode, a transparent conductive layer made of an oxide such as indium tin oxide (ITO) or indium zinc oxide can be used, but these are not limiting examples. Photolithography can be used for electrode formation.

The cathode may be made of a material having a low work function. Examples of such materials include alkali metals such as lithium; alkaline earth metals such as calcium; elemental metals such as aluminum, titanium, manganese, silver, lead, and chromium; and mixtures containing these elemental metals. Alloys of these elemental metals can also be used. For example, magnesium-silver, aluminum-lithium, aluminum-magnesium, silver-copper, and zinc-silver can be used. Metal oxides such as indium tin oxide (ITO) can also be used. These electrode materials may be used alone or in combination. The cathode may be formed of a single layer or multiple layers. In particular, silver is preferably used, and a silver alloy is more preferred to suppress aggregation of silver. As long as aggregation of silver can be suppressed, the content ratio in the alloy is not limited, and may be 1:1, for example.

The cathode is not particularly limited, and may be formed as a conductive layer of an oxide such as ITO to provide a top-emission element or may be formed as a reflection electrode of, for example, aluminum (Al) to provide a bottom-emission element. The cathode may be formed by any method, but, for example, DC and AC sputtering processes may be used because these methods provide good film coverage and readily reduce resistance.

Protective Layer

A protective layer may be disposed on the cathode. For example, by bonding a glass plate provided with a moisture absorbent to the cathode, permeation of, for example, water into the organic compound layers can be reduced, and the occurrence of a display failure can be reduced. In another embodiment, a passivation film made of, for example, silicon nitride may be disposed on the cathode to reduce permeation of, for example, water into the organic EL layers. For example, the protective layer may be formed in such a manner that after the formation of the cathode, the resultant is conveyed to another chamber without breaking the vacuum, and a silicon nitride film having a thickness of 2 μm is formed by CVD. After the film formation by CVD, atomic layer deposition (ALD) may be performed to form a protective layer. The protective layer is also referred to as a sealing layer.

Color Filter

A color filter may be disposed on the protective layer. For example, a color filter may be formed on another substrate so as to correspond to the size of the organic light emitting element and bonded to the substrate having the organic light emitting element disposed thereon. Alternatively, a color filter may be patterned on the above-described protective layer by photolithography. The color filter may be made of a polymer.

Planarization Layer

A planarization layer may be disposed between the color filter and the protective layer. The planarization layer may be made of an organic compound. The organic compound may have a low molecular weight or a high molecular weight, and preferably has a high molecular weight.

Two planarization layers may be disposed on opposite surfaces of the color filter, and the materials thereof may be the same or different. Specific examples of the materials include polyvinylcarbazole resins, polycarbonate resins, polyester resins, ABS resins, acrylic resins, polyimide resins, phenol resins, epoxy resins, silicone resins, and urea resins.

Counter Substrate

A counter substrate may be disposed on the planarization layer. The counter substrate is disposed at a position counter to the above-described substrate and thus is referred to as the counter substrate. The material forming the counter substrate may be the same as that of the above-described substrate.

Organic Layers

The organic compound layers (e.g., a hole injection layer, a hole transport layer, an electron blocking layer, a light emitting layer, a hole blocking layer, an electron transport layer, and an electron injection layer) constituting an organic light emitting element according to an embodiment of the present disclosure are formed by the following method.

The organic compound layers constituting an organic light emitting element according to an embodiment of the present disclosure can be formed using a dry process such as vacuum deposition, ion plating, sputtering, or plasma deposition. Alternatively, the organic compound layers can be formed using a wet process by applying a solution of an organic compound in an appropriate solvent by a known coating method (e.g., spin coating, dipping, casting, the LB technique, or an ink jet method).

When the layers are formed, for example, by vacuum deposition or solution coating, the layers are unlikely to undergo, for example, crystallization and are highly stable over time. When a coating method is used for film formation, an appropriate binder resin can be used in combination to form a film.

Examples of the binder resin include, but are not limited to, polyvinylcarbazole resins, polycarbonate resins, polyester resins, ABS resins, acrylic resins, polyimide resins, phenol resins, epoxy resins, silicone resins, and urea resins.

These binder resins may be used alone as a homopolymer or copolymer or may be used as a mixture of two or more.

In addition, known additives such as plasticizers, antioxidants, and UV absorbers may optionally be used in combination.

Applications of Organic Light Emitting Element According to Embodiment of Present Disclosure An organic light emitting element according to an embodiment of the present disclosure can be used as a component of a display apparatus or an illumination apparatus. Other applications include an exposure light source in an electrophotographic image-forming apparatus, a backlight in a liquid-crystal display apparatus, and a light emitting apparatus including a white light source with a color filter.

The display apparatus may be an image information processing apparatus including an image input unit configured to receive image information from, for example, an area CCD, a linear CCD, and a memory card, an information-processing unit configured to process the input information, and a display unit configured to display the input image.

The display unit of an image pickup apparatus or an ink-jet printer may have a touch panel function. The touch panel function may be activated by any system, such as an infrared system, an electrostatic capacitive system, a resistive film system, or an electromagnetic induction system. The display apparatus may also be used as a display unit of a multifunctional printer.

Figure 3:
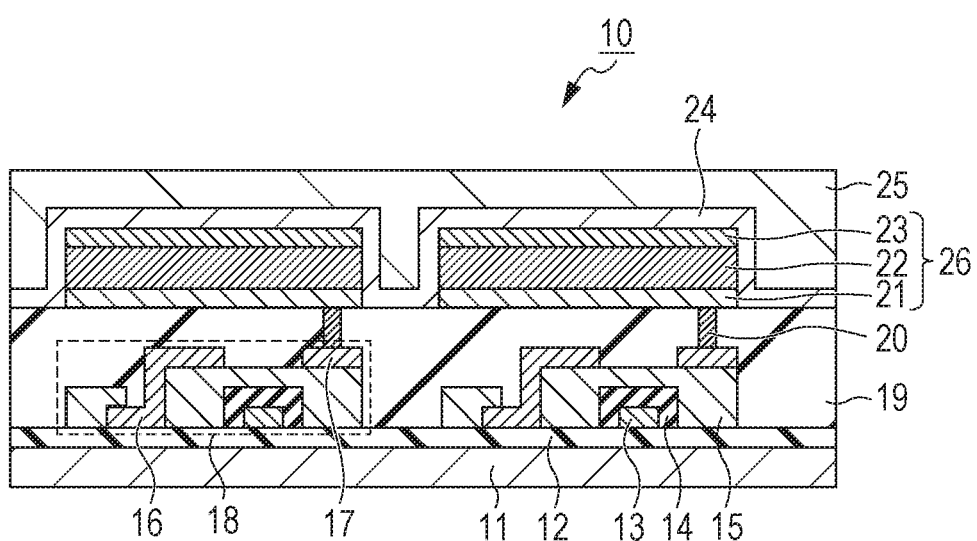
FIG. 3 is a schematic sectional view of an example of a display apparatus including an organic light emitting element according to an embodiment of the present disclosure.

Next, a display apparatus according to this embodiment will be described with reference to the drawings. FIG. 3 is a schematic sectional view illustrating an example of a display apparatus including an organic light emitting element and a TFT element connected to the organic light emitting element. The TFT element is an example of an active element.

A display apparatus 10 in FIG. 3 includes a substrate 11 made of, for example, such as glass or silicon and an insulating layer 12 disposed on the substrate. An active element 18 such as a TFT is disposed on the insulating layer, and a gate electrode 13, a gate insulating film 14, and a semiconductor layer 15 of the active element are disposed. The TFT 18 also includes a drain electrode 16 and a source electrode 17. An insulating film 19 is disposed over the TFT 18. An anode 21 constituting the organic light emitting element and the source electrode 17 are connected to each other through a contact hole 20 extending through the insulating film.

The electrodes (anode and cathode) included in the organic light emitting element and the electrodes (source electrode and drain electrode) included in the TFT need not necessarily be electrically connected to each other in the manner illustrated in FIG. 3. It is only required that either the anode or the cathode be electrically connected to either the source electrode or the drain electrode of the TFT. The term "TFT" refers to a thin-film transistor.

Although the organic compound layer is illustrated as a single layer in the display apparatus 10 in FIG. 3, the organic compound layer 22 may be composed of multiple layers. A first protective layer 24 and a second protective layer 25 for reducing deterioration of the organic light emitting element are disposed over the cathode 23.

Although a transistor is used as a switching element in the display apparatus 10 in FIG. 3, another switching element may be used instead.

The transistor used in the display apparatus 10 in FIG. 3 may not only be a transistor obtained using a single-crystal silicon wafer but also a thin-film transistor including a substrate and an active layer on an insulating surface of the substrate. The active layer may be made of, for example, single-crystal silicon, non-single-crystal silicon such as amorphous silicon or microcrystalline silicon, or a non-single-crystal oxide semiconductor such as indium zinc oxide or indium gallium zinc oxide. The thin-film transistor is also referred to as a TFT element.

The transistor included in the display apparatus 10 in FIG. 3 may be formed in a substrate such as a Si substrate. The phrase "formed in a substrate" means producing a transistor by processing a substrate itself, such as a Si substrate. That is, having a transistor in a substrate can also mean that the substrate and the transistor are integral with each other.

The organic light emitting element according to this embodiment has an emission luminance that is controlled by a TFT, which is an example of a switching element. Disposing a plurality of the organic light emitting elements in a screen enables a display of an image with different emission luminances. The switching element according to this embodiment need not necessarily be a TFT and may be a transistor formed of low-temperature polysilicon or an active matrix driver formed on a substrate such as a Si substrate. The active matrix driver may also be formed in the substrate. Whether a transistor is provided in the substrate or a TFT is used is chosen depending on the size of the display unit. For example, when the display unit has a size of about 0.5 inches, the organic light emitting element may be disposed on a Si substrate.

Figure 4:
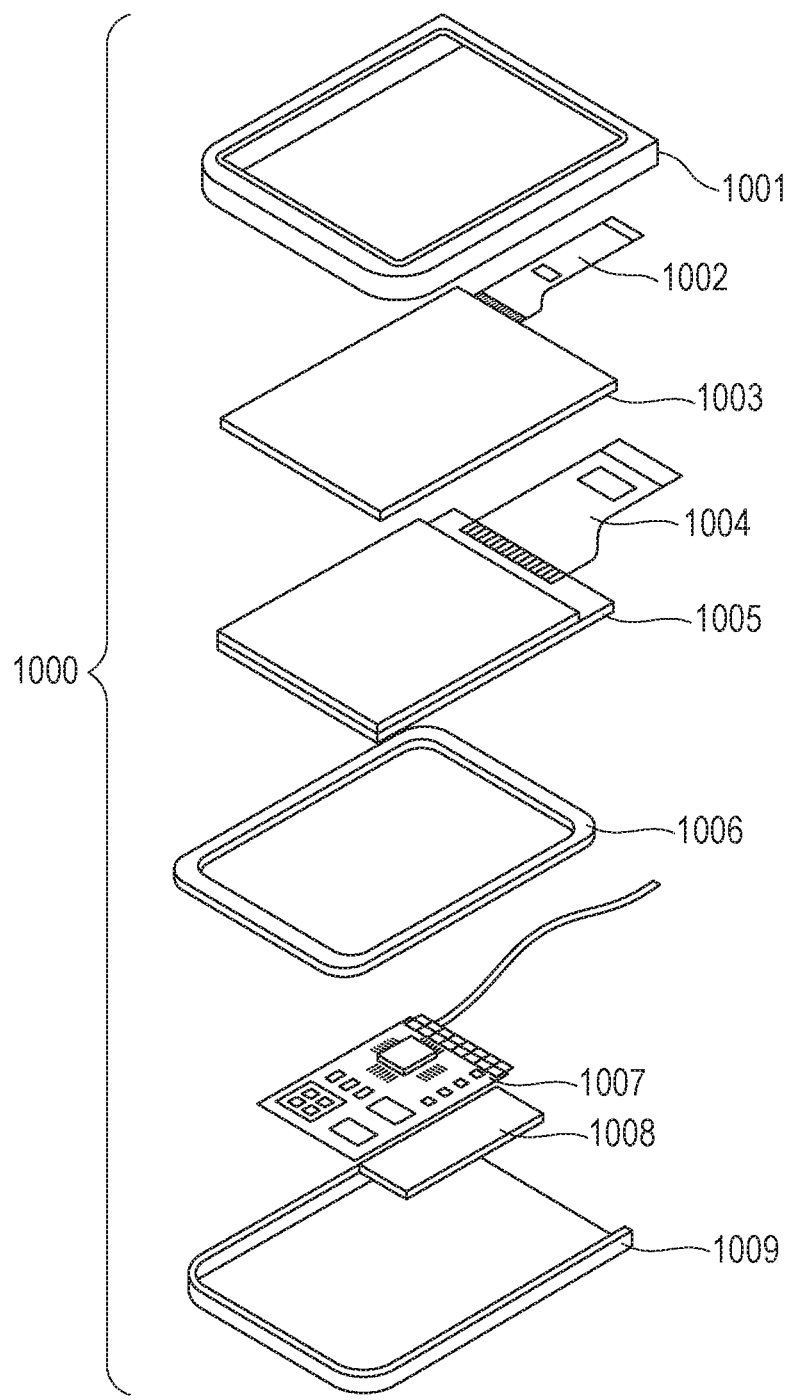
FIG. 4 is a schematic view illustrating an example of a display apparatus according to an embodiment of the present disclosure.

FIG. 4 is a schematic view illustrating an example of the display apparatus according to this embodiment. A display apparatus 1000 may include an upper cover 1001, a lower cover 1009, and a touch panel 1003, a display panel 1005, a frame 1006, a circuit board 1007, and a battery 1008 disposed between the upper cover 1001 and the lower cover 1009. Flexible print circuits (FPCs) 1002 and 1004 are connected to the touch panel 1003 and the display panel 1005, respectively. A transistor is printed on the circuit board 1007. The battery 1008 may be omitted if the display apparatus is not a mobile device. When the display apparatus is a mobile device, the battery 1008 may be disposed in another position.

The display apparatus according to this embodiment may include red, green, and blue color filters. The red, green, and blue color filters may be disposed in a delta arrangement.

The display apparatus according to this embodiment may be used in a display unit of a mobile terminal. In this case, the display apparatus may have both a display function and an operating function. Examples of mobile terminals include cellular phones such as smart phones, tablets, and head mount displays.

The display apparatus according to this embodiment may be used as a display unit of an image pickup apparatus that includes an optical unit including a plurality of lenses and an image pickup element configured to receive light that has passed through the optical unit. The image pickup apparatus may include a display unit configured to display information acquired by the image pickup element. The display unit may be exposed to the outside of the image pickup apparatus or disposed in a viewfinder. The image pickup apparatus may be a digital camera or a digital camcorder.

Figure 5A:
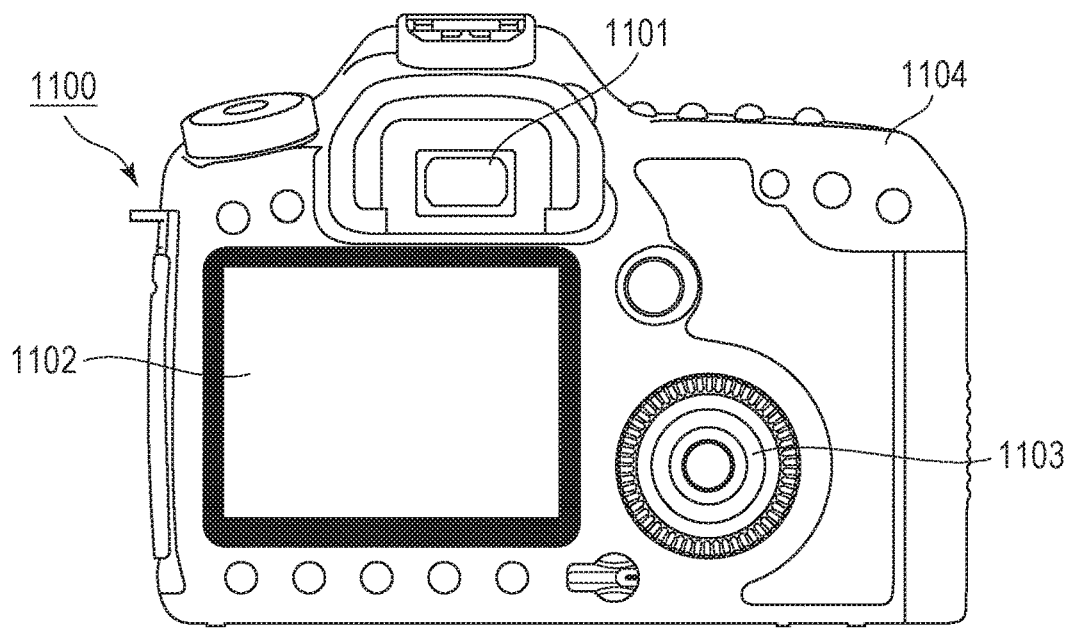
FIG. 5A is a schematic view illustrating an example of an image pickup apparatus according to an embodiment of the present disclosure.

FIG. 5A is a schematic view illustrating an example of an image pickup apparatus according to this embodiment. An image pickup apparatus 1100 may include a viewfinder 1101, a rear display 1102, an operation unit 1103, and a housing 1104. The viewfinder 1101 may include the display apparatus according to this embodiment. In this case, the display apparatus may display not only an image to be captured but also environmental information, image capturing instructions, and the like. The environmental information may be, for example, the intensity of external light, the direction of external light, the moving speed of a subject, and the possibility that the subject is hidden by an object.

Since the timing appropriate for capturing an image is only a moment, the information is desirably displayed as quickly as possible. Thus, the display apparatus including the organic light emitting element according to an embodiment of the present disclosure may be used. This is because the organic light emitting element has a high response speed. The display apparatus including the organic light emitting element is more suitable for use than such apparatuses and liquid crystal display apparatuses that are required to have a high display speed.

The image pickup apparatus 1100 includes an optical unit (not illustrated). The optical unit includes a plurality of lenses and focuses an image on the image pickup element accommodated in the housing 1104. By adjusting the relative positions of the plurality of lenses, the focal point can be adjusted. This operation can also be performed automatically.

Figure 5B:
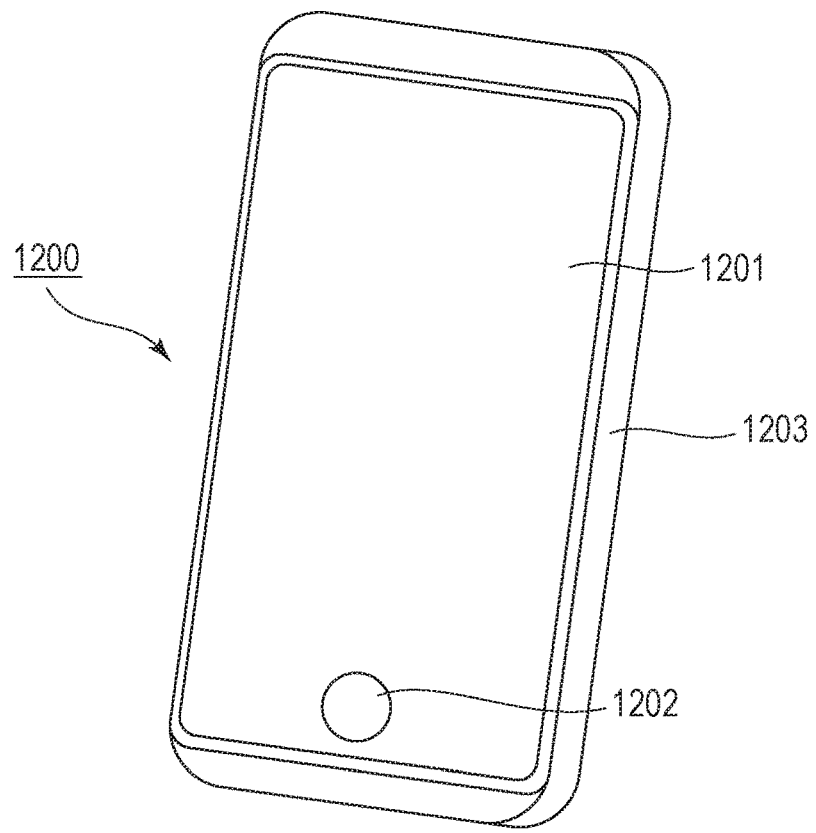
FIG. 5B is a schematic view illustrating an example of an electronic device according to an embodiment of the present disclosure.

FIG. 5B is a schematic view illustrating an example of an electronic device according to this embodiment. An electronic device 1200 includes a display unit 1201, an operation unit 1202, and a housing 1203. The display unit may include an organic light emitting element according to an embodiment of the present disclosure. The housing 1203 may include a circuit, a printed board including the circuit, a battery, and a communication unit. The operation unit 1202 may be a button or a touch-sensitive response unit. The operation unit may be a biometric recognition unit that, for example, releases a lock through recognition of fingerprints. An electronic device including a communication unit can also be referred to as a communication device. The electronic device may further has a camera function by including lenses and an image pickup element. An image captured by the camera function is displayed on the display unit. Examples of the electronic device include smartphones and notebook computers.

Figure 6A:
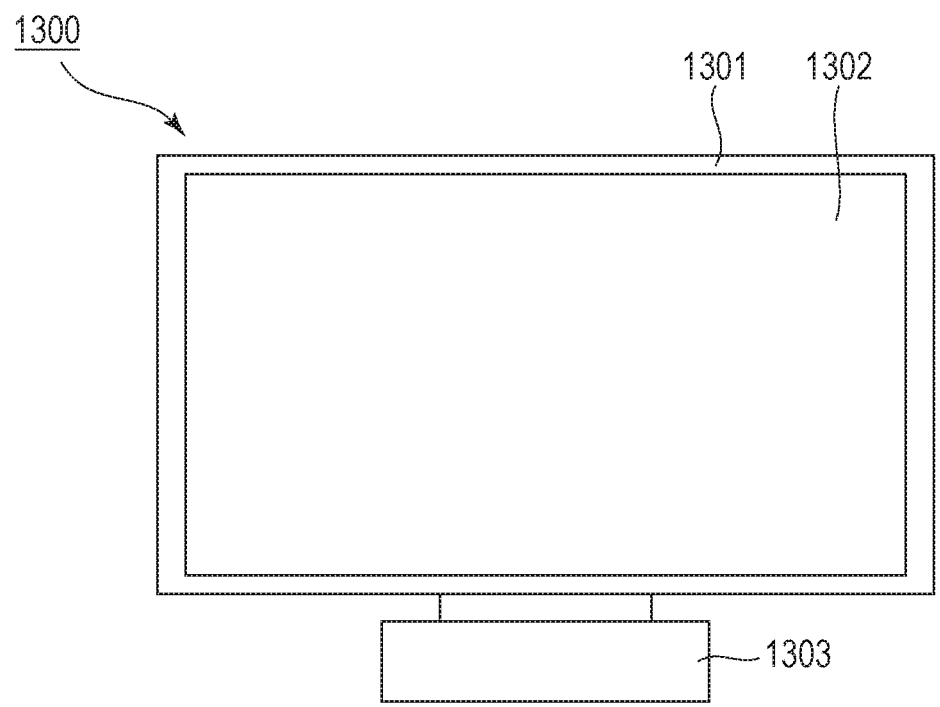
FIG. 6A is a schematic view illustrating an example of a display apparatus according to an embodiment of the present disclosure.
Figure 6B:
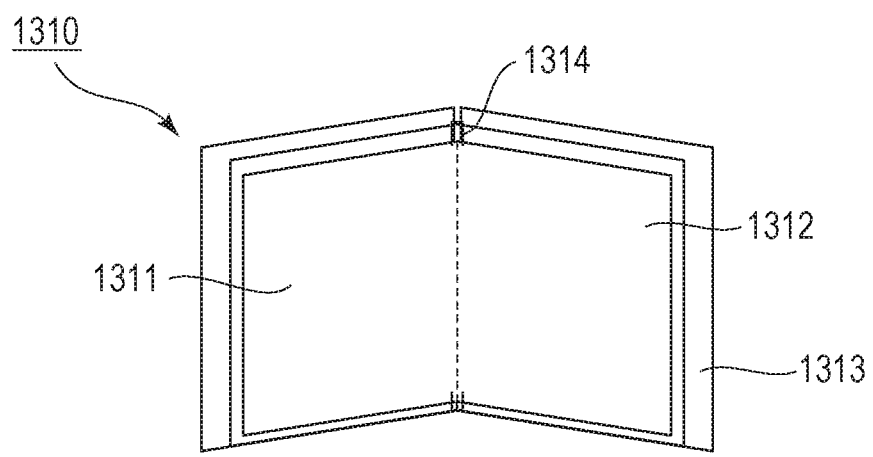
FIG. 6B is a schematic view illustrating an example of a foldable display apparatus.

FIGS. 6A and 6B are schematic views illustrating examples of the display apparatus according to this embodiment. FIG. 6A illustrates a display apparatus such as a television monitor or a PC monitor. A display apparatus 1300 includes a frame 1301 and a display unit 1302. The light emitting apparatus according to this embodiment may be used in the display unit 1302.

The display apparatus 1300 includes a base 1303 that supports the frame 1301 and the display unit 1302. The base 1303 need not necessarily be in the form illustrated in FIG. 6A. The lower side of the frame 1301 may serve as a base.

The frame 1301 and the display unit 1302 may be curved. The radius of the curvature may be 5,000 mm or more and 6,000 mm or less.

FIG. 6B is a schematic view illustrating another example of a display apparatus according to this embodiment. A display apparatus 1310 in FIG. 6B is configured to be foldable and is what is called a foldable display apparatus. The display apparatus 1310 includes a first display unit 1311, a second display unit 1312, a housing 1313, and a bending point 1314. The first display unit 1311 and the second display unit 1312 may include the light emitting apparatus according to this embodiment. The first display unit 1311 and the second display unit 1312 may be a seamless, monolithic display apparatus. The first display unit 1311 and the second display unit 1312 can be divided by the bending point. The first display unit 1311 and the second display unit 1312 may display different images, or the first and second display units may together display a single image.

Figure 7A:
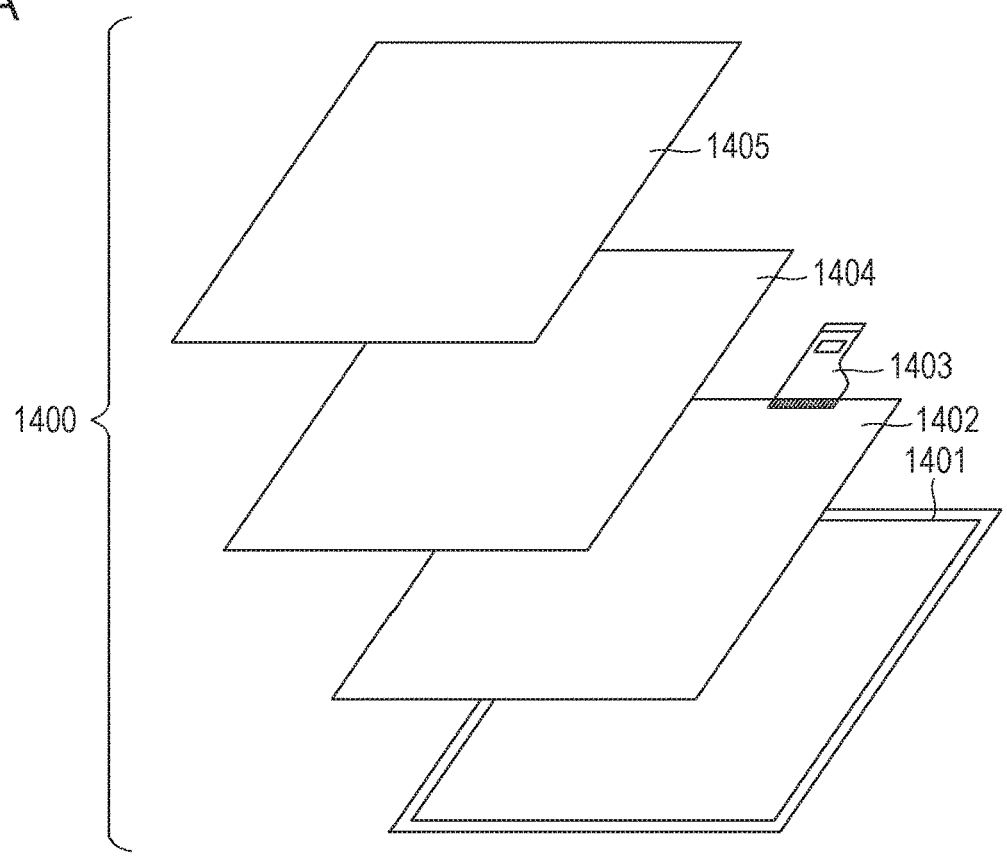
FIG. 7A is a schematic view illustrating an example of an illumination apparatus according to an embodiment of the present disclosure.

FIG. 7A is a schematic view illustrating an example of an illumination apparatus according to this embodiment. An illumination apparatus 1400 may include a housing 1401, a light source 1402, a circuit board 1403, an optical film 1404, and a light diffusion unit 1405. The light source may include the organic light emitting element according to this embodiment. The optical filter may be a filter for improving the color rendering properties of the light source. The light diffusion unit effectively diffuses light from the light source and helps the light reach a wide region for, for example, lighting up. The optical filter and the light diffusion unit may be disposed on the light emitting side of the illumination apparatus. Optionally, a cover may be disposed at an outermost portion.

The illumination apparatus is, for example, an indoor illumination apparatus. The illumination apparatus may emit light of cool white, day white, or any other color from blue to red. The illumination apparatus may include a modulation circuit configured to modulate the light. The illumination apparatus may include the organic light emitting element of the present disclosure and a power supply circuit connected thereto. The power supply circuit is a circuit that converts AC voltage to DC voltage. Cool white has a color temperature of 4200 K, and day white has a color temperature of 5000 K. The illumination apparatus may include a color filter.

The illumination apparatus according to this embodiment may also include a heat dissipation unit. The heat dissipation unit is configured to dissipate heat inside the apparatus out of the apparatus and may be made of, for example, a metal of high specific heat or liquid silicone.

Figure 7B:
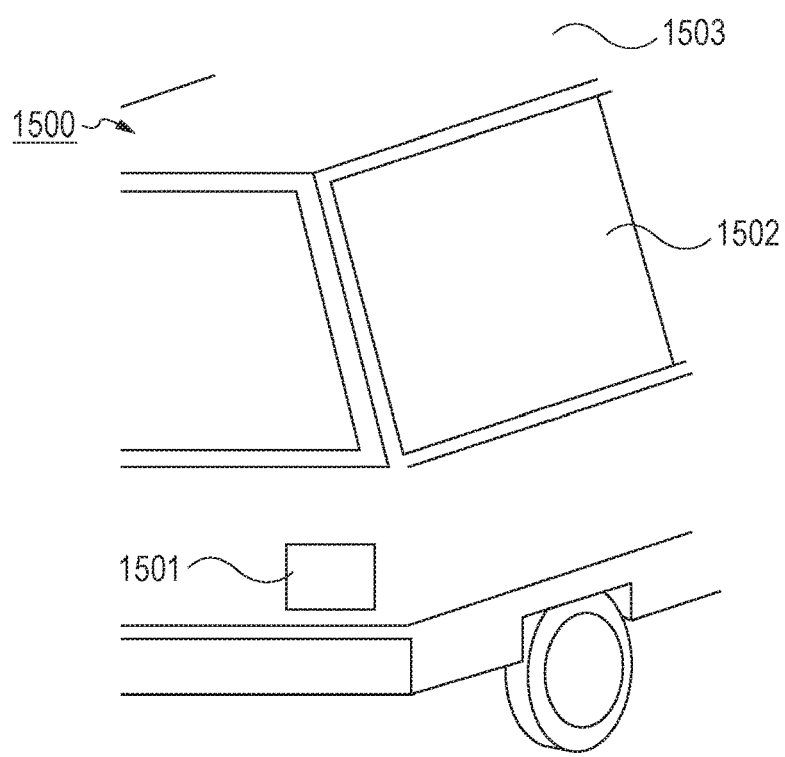
FIG. 7B is a schematic view illustrating an example of an automobile including a lighting fixture for vehicles according to an embodiment of the present disclosure.

FIG. 7B is a schematic view of an automobile that is an example of a moving object according to this embodiment. The automobile includes a tail lamp that is an example of a lighting fixture. An automobile 1500 includes a tail lamp 1501, and the tail lamp may be configured to be turned on in response to, for example, brake operation.

The tail lamp 1501 may include the organic light emitting element according to this embodiment. The tail lamp may include a protective member that protects the organic light emitting element. The protective member may be made of any material that is strong to some extent and transparent, for example, polycarbonate. A mixture of polycarbonate and, for example, a furandicarboxylic acid derivative or an acrylonitrile derivative may be used.

The automobile 1500 may include a car body 1503 and a window 1502 attached thereto. The window may be a transparent display unless it is a window for checking the front and rear of the automobile. The transparent display may include the organic light emitting element according to this embodiment. In this case, components, such as electrodes, of the organic light emitting element are made of transparent materials.

The moving object according to this embodiment may be, for example, a ship, an aircraft, or a drone. The moving object may include a body and a lighting fixture disposed on the body. The lighting fixture may emit light for allowing the position of the body to be recognized. The lighting fixture includes the organic light emitting element according to this embodiment.

As has been described above, using an apparatus including the organic light emitting element according to this embodiment enables a stable display with high image quality over a long period of time.

EXAMPLES

Example 1

Evaluation of HOMO and LUMO

Hosts and dopants were evaluated as described below. The results are shown in Table 1.

A) Method of Evaluating HOMO

A 30-nm-thick thin film was formed on an aluminum substrate, and the thin film was measured using an AC-3 (manufactured by RIKEN KEIKI Co., Ltd).

B) Method of Evaluating LUMO

A 30-nm-thick thin film was formed on a quartz substrate, and using the thin film as a target material, its optical band gap (absorption edges) was determined with a spectrophotometer (V-560 manufactured by JASCO Corporation). The optical band gap value was added to the above HOMO value to determine LUMO. The results are shown in Table 1.

Table 1 also shows calculated values obtained by molecular orbital calculations. Comparisons between the calculated values and the measured values show that HOMO and LUMO energies are correlated with each other. Thus, in EXAMPLES, HOMO and LUMO energy values determined from the calculated values are used to discuss the elements. In EXAMPLES, first to third compounds are referred to as hosts, and a red-light emitting material, a green-light emitting material, and a blue-light emitting material are referred to as a red dopant, a green dopant, and a blue dopant, respectively.

TABLE 1

| | Compound | HOMO (eV) Measured value | LUMO (eV) Measured value | HOMO (eV) Calculated value | LUMO (eV) Calculated value | | Compound | HOMO (eV) Measured value | LUMO (eV) Measured value | HOMO (eV) Calculated value | LUMO (eV) Calculated value |
|---|---|---|---|---|---|---|---|---|---|---|---|
| Host | EM1 | −6.0 | −3.1 | −5.1 | −1.7 | Blue dopant | BD46 | −5.5 | −2.7 | −4.7 | −1.5 |
| | EM2 | −6.0 | −3.0 | −5.1 | −1.6 | | BD45 | −6.1 | −3.3 | −5.2 | −1.7 |
| | EM3 | −5.9 | −3.0 | −5.1 | −1.6 | | BD40 | −6.1 | −3.4 | −5.2 | −1.8 |
| | EM4 | −6.0 | −3.0 | −5.2 | −1.7 | | BD41 | −6.1 | −3.4 | −5.2 | −1.9 |
| | EM5 | −6.0 | −3.1 | −5.1 | −1.6 | | BD42 | −5.9 | −3.3 | −5.0 | −1.8 |
| | EM7 | −6.0 | −3.1 | −5.0 | −1.7 | | BD34 | −6.2 | −3.5 | −5.4 | −2.1 |
| | EM10 | −6.3 | −2.8 | −5.7 | −1.2 | | BD31 | −6.4 | −3.7 | −5.6 | −2.2 |
| | EM13 | −6.0 | −3.1 | −5.1 | −1.5 | | BD25 | −6.4 | −3.7 | −5.7 | −2.3 |
| | EM17 | −5.7 | −3.5 | −4.7 | −2.1 | Green dopant | GD2 | −5.4 | −2.6 | −4.7 | −1.8 |
| | EM22 | −5.8 | −3.2 | −4.9 | −1.8 | | GD9 | −5.9 | −3.5 | −5.1 | −2.0 |
| | EM27 | −6.2 | −3.1 | −5.7 | −1.9 | | GD11 | −5.8 | −3.5 | −5.0 | −2.0 |
| | EM31 | −6.2 | −2.7 | −5.3 | −1.2 | | GD22 | −5.9 | −3.4 | −5.0 | −2.1 |
| Red dopar | RD5 | −5.6 | −3.6 | −4.7 | −2.4 | | GD27 | −5.8 | −3.5 | −5.0 | −2.1 |
| | RD10 | −5.6 | −3.6 | −5.0 | −2.6 | | | | | | |
| | RD15 | −5.5 | −3.5 | −4.6 | −2.3 | | | | | | |
| | RD21 | −5.7 | −3.6 | −4.8 | −2.5 | | | | | | |

Example 2

In this Example, an organic light emitting element having a top-emission structure was produced in which an anode, a hole injection layer, a hole transport layer, an electron blocking layer, a first light emitting layer, a second light emitting layer, a hole blocking layer, an electron transport layer, an electron injection layer, and a cathode were sequentially formed on a substrate.

A Ti film with a thickness of 40 nm was formed on a glass substrate by sputtering and patterned by photolithography to form an anode. The anode was formed so as to have an electrode area of 3 mm$^2$. The resultant was then washed.

Subsequently, the above-produced substrate provided with the electrode was attached to a vacuum deposition apparatus (manufactured by ULVAC, Inc.). After deposition materials were prepared for deposition, the apparatus was evacuated to $1.33 \times 10^{-4}$ Pa ($1 \times 10^{-6}$ Torr). Thereafter, the inside of a chamber was subjected to UV/ozone washing. Subsequently, layers were formed so as to have a layer structure as shown in Table 2 below.

TABLE 2

| | Materials | | | Thickness (nm) |
|---|---|---|---|---|
| Cathode | Mg:Ag (weight ratio 50:50) | | | 10 |
| Electron injection layer | LiF | | | 1 |
| Electron transport layer | ET2 | | | 20 |
| Hole blocking layer | ET12 | | | 80 |
| Second light emitting layer | Second host | EM1 | Weight ratio | 10 |
| | Second dopant (blue dopant) | BD25 | EM1:BD25 = 99.0:1.0 | |

TABLE 2-continued

|  |  | Materials | Thickness (nm) |
|---|---|---|---|
| First light emitting layer | First host | EM1 | Weight ratio EM1:RD5:GD10 = 96.5:0.5:3.0 | 10 |
|  | First dopant (green dopant) | GD10 |  |
|  | Third dopant (red dopant) | RD5 |  |
| Electron blocking layer |  | HT7 | 10 |
| Hole transport layer |  | HT2 | 18 |
| Hole injection layer |  | HT16 | 7 |

After the electron injection layer was formed, an ITO film with a thickness of 500 nm was formed by sputtering. Thereafter, the substrate was transferred into a glove box and sealed in a nitrogen atmosphere with a glass cap including a drying agent, to obtain an organic light emitting element.

The organic light emitting element obtained was connected to a voltage application device and evaluated for its characteristics. Current-voltage characteristics were measured with a 4140B microammeter manufactured by Hewlett-Packard Company, and chromaticity was evaluated using an "SR-3" manufactured by TOPCON CORPORATION. Emission luminance was measured with a BM7 manufactured by TOPCON CORPORATION. The efficiency, the voltage, and the CIE chromaticity coordinates during display at 1000 cd/m$^2$ were 6.4 cd/A, 3.4 V, and (0.36, 0.36), respectively, indicating that the organic light emitting element was a good element having high efficiency.

Next, emission spectra at a low current density (0.01 mA/cm$^2$) were evaluated. A peak height of an emission spectrum attributed to a red dopant was assumed to be 1.0, and peak heights of a blue dopant and a green dopant relative to the peak height of the red dopant were evaluated. Peak heights of less than 0.1 were evaluated as poor; peak heights of 0.1 or more and less than 0.5 were evaluated as fair; and peak heights of 0.5 or more were evaluated as good. In other words, when peak heights of blue light emission and green light emission are sufficiently high, good white light emission can be provided even at a low current density, that is, at low luminance. The results are shown in Table 3.

Furthermore, a continuous operation test was performed at an initial luminance of 2000 cd/m$^2$, and the decrease in luminance after 100 hours was determined. The results are shown in Table 3.

Example 3 to 8 and Comparative Example 1

Organic light emitting elements were produced in the same manner as in Example 2 except that the compounds of the first light emitting layer and the second light emitting layer of the organic light emitting element were changed to compounds shown in Table 3. The organic light emitting elements produced were measured and evaluated for their characteristics in the same manner as in Example 2. The results are shown in Table 3.

TABLE 3

| | First light emitting layer | | | | | | Second light emitting layer | | | | | |
|---|---|---|---|---|---|---|---|---|---|---|---|---|
| | First host | | Third dopant | | First dopant | | Second host | | Second dopant | | | |
| | HOMO (H1) [eV] | LUMO (H1) [eV] | HOMO (D3) [eV] | LUMO (D3) [eV] | HOMO (D1) [eV] | LUMO (D1) [eV] | HOMO (H2) [eV] | LUMO (H2) [eV] | HOMO (D2) [eV] | LUMO (D2) [eV] | Decrease in luminance [%] | Peak height ratio Blue / Green |
| Example 2 | EM1 | | RD5 | | GD27 | | EM1 | | BD25 | | 7 | good good |
| | −5.1 | −1.7 | −4.7 | −2.4 | −5.0 | −2.1 | −5.1 | −1.7 | −5.7 | −2.3 | | |
| Example 3 | EM1 | | RD5 | | GD9 | | EM1 | | BD25 | | 7 | good good |
| | −5.1 | −1.7 | −4.7 | −2.4 | −5.0 | −2.0 | −5.1 | −1.7 | −5.7 | −2.3 | | |
| Example 4 | EM1 | | RD21 | | GD10 | | EM1 | | BD26 | | 7 | good good |
| | −5.2 | −1.6 | −4.7 | −2.4 | −5.1 | −2.0 | −5.1 | −1.7 | −5.7 | −2.3 | | |
| Example 5 | EM1 | | RD5 | | GD11 | | EM4 | | BD27 | | 8 | good good |
| | −5.1 | −1.7 | −4.7 | −2.4 | −5.0 | −2.0 | −5.2 | −1.7 | −5.5 | −2.2 | | |
| Example 6 | EM1 | | RD5 | | GD9 | | EM5 | | BD31 | | 9 | good good |
| | −5.1 | −1.7 | −4.7 | −2.4 | −5.0 | −2.0 | −5.2 | −1.6 | −5.6 | −2.2 | | |
| Example 7 | EM1 | | RD5 | | GD11 | | EM3 | | BD34 | | 10 | good good |
| | −5.1 | −1.7 | −4.7 | −2.4 | −5.0 | −2.0 | −5.1 | −1.6 | −5.4 | −2.1 | | |
| Example 8 | EM1 | | RD5 | | GD10 | | EM31 | | BD27 | | 20 | good good |
| | −5.1 | −1.7 | −4.7 | −2.4 | −5.1 | −2.0 | −5.3 | −1.2 | −5.5 | −2.2 | | |
| Comparative example 1 | EM1 | | RD5 | | GD10 | | EM1 | | BD40 | | 8 | poor fair |
| | −5.1 | −1.7 | −4.7 | −2.4 | −5.1 | −2.0 | −5.1 | −1.7 | −5.2 | −1.8 | | |

In the organic light emitting elements of Examples 2 to 8, the ΔLUMO (=LUMO (H2)−LUMO (D2)) of the second light emitting layer, i.e., the light emitting layer on the cathode side was larger than the ΔLUMO (=LUMO (H1)−LUMO (D1)) of the first light emitting layer, whereby white light emission with a good balance between red, green, and blue in a low luminance range was observed. In Example 8, however, although well-balanced white light emission was observed, the durability was a little worse than in other Examples. This is because the host material of the blue-light emitting layer was EM31 (amine compound), which is not a compound consisting of a hydrocarbon.

In Comparative Example 1, well-balanced light emission was not observed. This is probably partly because recombination regions are localized in the first light emitting layer due to low electron-trapping properties of the second light emitting layer. That is, well-balanced light emission was not provided because the ΔLUMO of the second light emitting layer was smaller than that of the first light emitting layer.

Example 9

In this Example, an organic light emitting element having a bottom-emission structure was produced in which an anode, a hole injection layer, an electron blocking layer, a hole transport layer, a first light emitting layer, a second light emitting layer, a third light emitting layer, a hole blocking layer, an electron transport layer, an electron injection layer, and a cathode were sequentially formed on a substrate.

First, an ITO film was formed on a glass substrate and subjected to desired patterning to form an ITO electrode (anode). At this time, the ITO electrode was formed so as to have a thickness of 100 nm and an electrode area of 3 mm$^2$. The substrate on which the ITO electrode was formed in this manner was used as an ITO substrate in the following process. Next, organic EL layers and an electrode layer shown in Table 4 below were continuously formed on the ITO substrate by performing vacuum deposition by resistance heating in a vacuum chamber at $1.33 \times 10^{-4}$ Pa.

TABLE 4

|  | Materials |  | Thickness (nm) |
|---|---|---|---|
| Cathode |  | Al | 100 |
| Electron injection layer |  | LiF | 1 |
| Electron transport layer |  | ET5 | 30 |
| Hole blocking layer |  | ET17 | 70 |
| Second light emitting layer | Second host | EM1 | Weight ratio | 10 |
|  | Second dopant (blue dopant) | BD25 | EM1:BD25 = 99.0:1.0 |  |
| First light emitting layer | First host | EM1 | Weight ratio | 10 |
|  | First dopant (green dopant) | GD11 | EM1:GD11 = 99.0:1.0 |  |
| Third light emitting layer | Third host | EM1 | Weight ratio | 10 |
|  | Third dopant (red dopant) | RD5 | EM1:RD5 = 99.5:0.5 |  |
| Electron blocking layer |  | HT12 | 10 |
| Hole transport layer |  | HT3 | 18 |
| Hole injection layer |  | HT16 | 7 |

The substrate was then transferred into a glove box and sealed in a nitrogen atmosphere with a glass cap including a drying agent, to obtain an organic light emitting element.

The organic light emitting element obtained was measured and evaluated for its characteristics in the same manner as in Example 2. The results are shown in Table 6.

Examples 10 to 12 and Comparative Examples 3 to 5

Organic light emitting elements were produced in the same manner as in Example 9 except that the compounds of the first light emitting layer, the second light emitting layer, and the third light emitting layer were changed to compounds shown in Table 5. The organic light emitting elements produced were measured and evaluated for their characteristics in the same manner as in Example 9. The measurement results are shown in Table 6.

TABLE 5

|  | Third light emitting layer | | | | First light emitting layer | | | | Second light emitting layer | | | |
|---|---|---|---|---|---|---|---|---|---|---|---|---|
|  | Third host | | Third dopant | | First host | | First dopant | | Second host | | Second dopant | |
|  | HOMO (H3) [eV] | LUMO (H3) [eV] | HOMO (D3) [eV] | LUMO (D3) [eV] | HOMO (H1) [eV] | LUMO (H1) [eV] | HOMO (D1) [eV] | LUMO (D1) [eV] | HOMO (H2) [eV] | LUMO (H2) [eV] | HOMO (D2) [eV] | LUMO (D2) [eV] |
| Example 9 | EM1 | | RD5 | | EM1 | | GD11 | | EM1 | | BD25 | |
|  | −5.1 | −1.7 | −4.7 | −2.4 | −5.1 | −1.7 | −5.0 | −2.0 | −5.1 | −1.7 | −5.7 | −2.3 |
| Example 10 | EM1 | | RD5 | | EM1 | | GD10 | | EM1 | | BD25 | |
|  | −5.1 | −1.7 | −4.7 | −2.4 | −5.1 | −1.7 | −5.0 | −2.0 | −5.1 | −1.7 | −5.7 | −2.3 |

TABLE 5-continued

| | Third light emitting layer | | | | First light emitting layer | | | | Second light emitting layer | | | |
|---|---|---|---|---|---|---|---|---|---|---|---|---|
| | Third host | | Third dopant | | First host | | First dopant | | Second host | | Second dopant | |
| | HOMO (H3) [eV] | LUMO (H3) [eV] | HOMO (D3) [eV] | LUMO (D3) [eV] | HOMO (H1) [eV] | LUMO (H1) [eV] | HOMO (D1) [eV] | LUMO (D1) [eV] | HOMO (H2) [eV] | LUMO (H2) [eV] | HOMO (D2) [eV] | LUMO (D2) [eV] |
| Example 11 | none | | | | EM1 | | EM17 | | EM1 | | BD25 | |
| Example 12 | EM1 | | RD5 | | −5.1 EM1 | −1.7 | −4.9 GD2 | −1.8 | −5.1 EM1 | −1.7 | −5.7 BD25 | −2.3 |
| Comparative Example 2 | −5.1 EM1 | −1.7 | −4.7 RD5 | −2.4 | −5.1 EM1 | −1.7 | −4.7 GD2 | −1.8 | −5.1 EM1 | −1.7 | −5.7 BD46 | −2.3 |
| Comparative Example 3 | −5.1 none | −1.7 | −4.7 | −2.4 | −5.1 EM1 | −1.7 | −4.7 EM17 | −1.8 | −5.1 EM1 | −1.7 | −4.7 BD49 | −1.5 |
| | | | | | −5.1 | −1.7 | −4.9 | −1.8 | −5.1 | −1.7 | −4.6 | −1.4 |

TABLE 6

| | Example 9 | Example 10 | Example 12 | Comparative Example 2 | | Example 11 | Comparative Example 3 |
|---|---|---|---|---|---|---|---|
| Decrease in luminance [%] | 9 | 8 | 14 | 21 | Decrease in luminance [%] | 10 | 15 |
| Peak height Blue Green ratio | good good | good good | good good | fair good | Peak height Blue Yellow ratio | good good | poor good |

As in Examples 9 to 12, the organic light emitting elements according to an embodiment of the present disclosure were found to provide well-balanced white light emission. In Example 12, however, although well-balanced white light emission was observed, the durability was a little worse than in other Examples. This is because the green dopant of the first light emitting layer was GD2 (amine compound).

In Comparative Example 2, well-balanced light emission was not observed because the ΔLUMO (=LUMO (H2)−LUMO (D2)) of the second light emitting layer was smaller than the ΔLUMO (=LUMO (H1)−LUMO (D1)) of the first light emitting layer. In addition, a significant decrease in durability was observed. This is because the green dopant of the first light emitting layer was GD3 (amine compound) and the blue dopant of the second light emitting layer was BD46 (amine compound). In Comparative Example 3, well-balanced light emission was not observed. This is probably partly because recombination regions are localized in the first light emitting layer due to low electron-trapping properties of the second light emitting layer.

As described above, an organic light emitting element according to an embodiment of the present disclosure is less likely to undergo a change in light emission balance due to a change in current density.

According to the present disclosure, an organic light emitting element less likely to undergo a change in light emission balance due to a change in current density can be provided.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-114967, filed Jun. 20, 2019, which is hereby incorporated by reference herein in its entirety.

What is claimed is:

1. An organic light emitting element comprising, in sequence:
   an anode;
   a first light emitting layer;
   a second light emitting layer; and
   a cathode,
   wherein the second light emitting layer includes a second compound and a second light emitting material,
   the first light emitting layer includes a first compound, a first light emitting material having an energy gap different from that of the second light emitting material, and a third light emitting material having an energy gap smaller than that of the first light emitting material, and
   the organic light emitting element satisfies relations (a) to (d):

$LUMO(H1) > LUMO(D1)$      (a)

$LUMO(H2) > LUMO(D2)$      (b)

$LUMO(H2) - LUMO(D2) > LUMO(H1) - LUMO(D1)$      (c)

$LUMO(H1) > LUMO(D3)$      (d)

where LUMO (H1), LUMO (D1), LUMO (H2), LUMO (D2), and LUMO (D3) represent a lowest unoccupied molecular orbital (LUMO) level of the first compound, a LUMO level of the first light emitting material, a LUMO level of the second compound, a LUMO level of the second light emitting material, and a LUMO energy of the third light emitting material, respectively.

2. The organic light emitting element according to claim 1, wherein the second light emitting material has a larger energy gap than the first light emitting material.

3. The organic light emitting element according to claim 1, wherein the first light emitting layer and the second light emitting layer are in contact with each other.

4. The organic light emitting element according to claim 1, wherein the first light emitting material and the second light emitting material satisfy relation (e):

$$LUMO(D1) > LUMO(D2) \qquad (e).$$

5. The organic light emitting element according to claim 1, wherein the first compound and the first light emitting material satisfy relation (g):

$$LUMO(H1) - LUMO(D1) > HOMO(D1) - HOMO(H1) \qquad (g)$$

where HOMO (H1) represents a highest occupied molecular orbital (HOMO) level of the first compound and HOMO (D1) represents a HOMO level of the first light emitting material.

6. The organic light emitting element according to claim 1, wherein the second compound and the second light emitting material satisfy relation (h):

$$HOMO(H2) > HOMO(D2) \qquad (h)$$

where HOMO (H2) represents a highest occupied molecular orbital (HOMO) level of the second compound and HOMO (D2) represents a HOMO level of the second light emitting material.

7. The organic light emitting element according to claim 1, wherein in the first light emitting layer, a weight percentage of the first compound is higher than a weight percentage of the first light emitting material, and in the second light emitting layer, a weight percentage of the second compound is higher than a weight percentage of the second light emitting material.

8. The organic light emitting element according to claim 1, wherein the second light emitting material is a compound that emits blue light.

9. The organic light emitting element according to claim 1, wherein the second light emitting material is a compound that emits blue light, and the first light emitting material and the third light emitting material are each a compound that emits green light or a compound that emits red light.

10. The organic light emitting element according to claim 1, wherein the organic light emitting element emits white light.

11. The organic light emitting element according to claim 1, wherein the first compound and the second compound are each a compound consisting of a hydrocarbon.

12. The organic light emitting element according to claim 1, wherein the first light emitting material and the second light emitting material are each a compound having a fluoranthene skeleton.

13. The organic light emitting element according to claim 1, wherein the second light emitting material is a compound having two or more electron-withdrawing substituents.

14. An organic light emitting element comprising, in sequence:
an anode;
a third light emitting layer;
a first light emitting layer;
a second light emitting layer; and
a cathode,
wherein the second light emitting layer includes a second compound and a second light emitting material,
the first light emitting layer includes a first compound and a first light emitting material having an energy gap different from that of the second light emitting material,
the third light emitting layer includes a third compound and a third light emitting material having an energy gap smaller than that of the first light emitting material, and
the organic light emitting element satisfies relations (a) to (d):

$$LUMO(H1) > LUMO(D1) \qquad (a)$$

$$LUMO(H2) > LUMO(D2) \qquad (b)$$

$$LUMO(H2) - LUMO(D2) > LUMO(H1) - LUMO(D1) \qquad (c)$$

$$LUMO(H3) > LUMO(D3) \qquad (d)$$

where LUMO (H1), LUMO (D1), LUMO (H2), LUMO (D2), LUMO (H3), and LUMO (D3) represent a lowest unoccupied molecular orbital (LUMO) level of the first compound, a LUMO level of the first light emitting material, a LUMO level of the second compound, a LUMO level of the second light emitting material, a LUMO energy of the third compound, and a LUMO energy of the third light emitting material, respectively.

15. The organic light emitting element according to claim 14, wherein the second light emitting material is a compound that emits blue light, the first light emitting material is a compound that emits green light, and the third light emitting material is a compound that emits red light.

16. A display apparatus comprising a plurality of pixels, wherein at least one of the plurality of pixels includes the organic light emitting element according to claim 1 and a transistor connected to the organic light emitting element.

17. An image pickup apparatus comprising:
an optical unit including a plurality of lenses;
an image pickup element configured to receive light that has passed through the optical unit; and
a display unit configured to display an image captured by the image pickup element,
wherein the display unit includes the organic light emitting element according to claim 1.

18. An illumination apparatus comprising:
a light source including the organic light emitting element according to claim 1; and
a light diffusion unit or an optical film configured to transmit light emitted from the light source.

19. A moving object comprising:
a lighting fixture including the organic light emitting element according to claim 1; and
a body provided with the lighting fixture.

* * * * *